United States Patent
Parkin et al.

(10) Patent No.: US 9,704,551 B2
(45) Date of Patent: Jul. 11, 2017

(54) MAGNETIC TUNNEL JUNCTION SWITCHING ASSISTED BY TEMPERATURE-GRADIENT INDUCED SPIN TORQUE

(71) Applicant: INTERNATIONAL BUSINESS MACHINES CORPORATION, Armonk, NY (US)

(72) Inventors: Stuart S.P. Parkin, San Jose, CA (US); Timothy Phung, Milpitas, CA (US); Aakash Pushp, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/700,015

(22) Filed: Apr. 19, 2015

(65) Prior Publication Data

US 2016/0322091 A1 Nov. 3, 2016

(51) Int. Cl.
  *G11C 11/00* (2006.01)
  *G11C 11/16* (2006.01)
  *G11C 19/08* (2006.01)

(52) U.S. Cl.
  CPC .......... *G11C 11/161* (2013.01); *G11C 11/165* (2013.01); *G11C 11/1675* (2013.01); *G11C 19/0808* (2013.01)

(58) Field of Classification Search
  CPC . G11C 11/161; G11C 11/165; G11C 11/1675; G11C 19/0808
  USPC .................. 365/148, 158, 171, 173
  See application file for complete search history.

(56) References Cited

U.S. PATENT DOCUMENTS

| 7,679,155 | B2 | 3/2010 | Korenivski |
| 7,948,044 | B2 | 5/2011 | Horng et al. |
| 8,203,191 | B2 | 6/2012 | Uchida et al. |
| 8,208,295 | B2 | 6/2012 | Dieny |
| 8,289,759 | B2 | 10/2012 | Wang et al. |
| 8,379,352 | B1 | 2/2013 | Braganca et al. |
| 8,456,894 | B2 | 6/2013 | Abraham et al. |
| 8,750,013 | B1 | 6/2014 | Abraham et al. |
| 8,750,028 | B2 | 6/2014 | Ogimoto |
| 8,754,491 | B2 | 6/2014 | Abraham et al. |
| 8,908,424 | B2 | 12/2014 | Wang et al. |
| 2012/0280338 | A1* | 11/2012 | Abraham .............. H01L 27/222 257/421 |

(Continued)

OTHER PUBLICATIONS

W. F. Brinkman, R. C. Dyner, and J. M. Rowell "Tunneling Conductance of Asymmetriccal Barrier" Apr. 1970.*

(Continued)

*Primary Examiner* — Tha-O H Bui
(74) *Attorney, Agent, or Firm* — Daniel E. Johnson

(57) ABSTRACT

Thermal-spin-torque (TST) in a magnetic tunnel junction (MTJ) is demonstrated by generating large temperature gradients across ultrathin MgO tunnel barriers, with this TST being significant enough to considerably affect the magnitude of the switching field of the MTJ. The origin of the TST is attributed to an asymmetry of the tunneling conductance across the zero-bias voltage of the MTJ. Through magneto-Seebeck voltage measurements, it is estimated that the charge-current that would be generated due to the temperature gradient would give rise to spin-transfer-torque (STT) that is a thousand times too small to account for the observed changes in switching fields, indicating the presence of large TST.

11 Claims, 23 Drawing Sheets

(56) References Cited

U.S. PATENT DOCUMENTS

| | | | | |
|---|---|---|---|---|
| 2012/0281460 | A1* | 11/2012 | Abraham | G11B 5/02 365/158 |
| 2012/0281467 | A1* | 11/2012 | Abraham | G11C 11/1675 365/171 |
| 2012/0319221 | A1 | 12/2012 | Apalkov et al. | |
| 2014/0015074 | A1 | 1/2014 | Bedau et al. | |

OTHER PUBLICATIONS

Hatami et al., "Thermal Spin-Transfer Torque in Magnetoelectric Devices." The American Physical Society, vol. 99, pp. 066603-1-066603-4, (Aug. 2007).

Hatami et al., "Thermoelectric effects in magnetic nanostructures." The American Physical Society, vol. B 79, pp. 174426-1-174426-13, (2009).

Jaworski et al., "Giant spin Seebeck effect in a non-magnetic material." Nature, vol. 487, issue 7406, pp. 210-213, (Jul. 12, 2012).

Jia et al., "Thermal Spin Transfer in Fe-MgO-Fe Tunnel Junctions." Physical Review Letters, vol. 107, pp. 176603-1-176603-5, (Oct. 2011).

Le Breton et al., "Thermal Spin Current from a ferromagnet to silicon by Seeback spin tunneling." Nature, vol. 475, issue 7354, pp. 82-85, (Jun. 29, 2011).

Liebing et al., "Tunneling Magnetothermopower in Magnetic Tunnel Junction Nanopillars." The American Physical Society, vol. 107, pp. 177201-1-177201-4, (Oct. 2011).

Lin et al., "Giant spin-dependent thermoelectric effect in magnetic tunnel junctions." Nature Communications, vol. 3, pp. 1-6, (Mar. 2012).

Nogi et al., "Preparation and magnetotransport properties of MgO-barrier-based magnetic double tunnel junctions including nonmagnetic nanoparticles." Journal of Physics D: Applied Physics, vol. 40, No. 5, pp. 1242-1246, Feb. 16, 2007).

Saito et al., "Bias voltage and annealing-temperature dependences of magnetoresistance ratio in Ir-Mn exchange-baised double tunnel junctions." Journal of Magnetism and Magnetic Materials, vol. 223, issue 3, pp. 293-298, (Feb. 2001).

Slonczewski, "Initiation of spin-transfer torque by thermal transport from magnons." The American Physical Society, vol. B 82, pp. 054403-1-054403-11, (2010).

Walter et al., "Seebeck effect in magnetic tunnel junctions." Nature Materials, vol. 10, pp. 742-746, (Jul. 24, 2011).

Yu et al., "Evidence for Thermal Spin-Transfer Torque." The American Physical Society, vol. 104, pp. 146601-1-146601-4, (2010).

* cited by examiner

| $j$ (A/cm²) | $T_{bottom}^{MgO}(K)$ | $T_{top}^{MgO}(K)$ | $\Delta T^{MgO}(K)$ |
|---|---|---|---|
| 3.5x10³ | 10.0 | 10.0 | 0.0 |
| 1x10⁴ | 10.0 | 10.0 | 0.0 |
| 3.5x10⁴ | 10.0 | 10.0 | 0.0 |
| 3.5x10⁵ | 12.1 | 12.2 | 0.1 |
| 5x10⁵ | 14.0 | 14.1 | 0.1 |
| 1x10⁶ | 22.2 | 22.6 | 0.4 |
| 1.5x10⁶ | 31.7 | 32.3 | 0.6 |
| 2x10⁶ | 41.7 | 42.6 | 0.9 |
| 2.5x10⁶ | 52.0 | 53.2 | 1.2 |
| 3x10⁶ | 62.6 | 64.0 | 1.4 |
| 3.5x10⁶ | 73.3 | 74.9 | 1.6 |

| Device / Magnetic Configuration | Asymmetry present in $G_{norm}$ across V = 0 | TST Present |
|---|---|---|
| Device I / AP | ✓ | ✓ |
| Device I / P | ✗ | ✗ |
| Device II / AP | ✓ | ✓ |
| Device II / P | ✗ | ✗ |
| Device III / AP | ✗ | ✗ |
| Device III / P | ✗ | ✗ |

MAGNETIC TUNNEL JUNCTION SWITCHING ASSISTED BY TEMPERATURE-GRADIENT INDUCED SPIN TORQUE

TECHNICAL FIELD

The invention relates to switching magnetic tunnel junctions using spin currents created by a temperature gradient, and more particularly, to the use of such technology in a magnetic random access memory device.

BACKGROUND

One of the most exciting potential new memory technologies is magnetic random access memory (MRAM) based on advanced spintronics, which promises to be a high performance, non-volatile memory. The essential feature of MRAM is the switching of a magnetic tunnel junction (MTJ) memory cell between two distinct resistance states associated with the relative magnetic orientation of the ferromagnetic electrodes sandwiching the tunnel barrier. This switching can be achieved by passing spin polarized charge currents directly through the MTJ, so that switching is induced via spin transfer torque (STT); however, the current densities that are required are currently too large to make it a viable technology. A number of different approaches are being pursued to decrease the current density, using novel materials and physics. In particular, there has been a great deal of interest in the generation of spin currents without any significant charge currents through the use of temperature gradients (i.e., 'spin-caloritronics'). However, the demonstration of the potential of thermally induced spin currents for MRAM has not been realized due to the difficulty in creating sufficiently large temperature gradients across the ultra-thin tunnel barriers needed for useful applications.

On the other hand, using heat to create gradients and charge-currents has been an active area of research in thermoelectrics (1). Spin caloritronics (2, 3) adds a new dimension to this concept by employing heat to create spin-dependent chemical potential gradients in ferromagnetic materials (4). Traditionally, electric current driven spin-currents have been used to transport spin angular momentum to change the magnetization of a magnetic material a phenomenon known as spin-transfer-torque (STT) (5-7). Heat currents can also create spin-currents in magnetic materials; the transfer of spin angular momentum through this process has been called thermal-spin-torque (TST) (8, 9). A number of experiments employing spin currents generated by heat have been reported, including: the spin-Seebeck effect observed in ferromagnetic metals (10, 11), semiconductors (12) and insulators (13); thermal spin injection from a ferromagnet into a non-magnetic metal (14); the magneto-Seebeck effect observed in magnetic tunnel junctions (15-17); Seebeck spin tunneling in ferromagnet-oxide-silicon tunnel junctions (18); and several others (19, 20). On the other hand, while there have been several theoretical predictions (8, 9, 21, 22) of the TST, few experiments have been reported to date.

SUMMARY

We find that a temperature gradient of ~1 K/nm across a 0.9 nm thick MgO tunnel barrier in an MTJ induces modest charge currents (corresponding to current densities on the order of $1 \times 10^3$ A/cm$^2$), in addition to large spin currents that induce significant TST. The TST is as large as the STT that would be created solely by a charge current density of $1 \times 10^6$ A/cm$^2$ in the devices herein (which are otherwise similar to previously reported MTJ devices (24)). Furthermore, the TST is strongly dependent on the orientation of the free layer (FL) with respect to the reference layer (RL). We show that the TST can be attributed to an asymmetry in the tunneling conductance across zero bias, which is consistent with the spin accumulation in the free layer of the MTJ due to the temperature gradient across the tunnel barrier of the MTJ.

One aspect of the invention is a method that includes creating a temperature gradient across a tunnel barrier that separates a magnetic reference layer and a magnetic free layer, thereby inducing a thermal spin current across the tunnel barrier. The magnetic layers and the tunnel barrier advantageously form a magnetic tunnel junction. The thermal spin current reduces the magnitude of any magnetic field and/or electrical spin current required to switch the free layer. (If a magnetic field alone is used to switch the free layer, the field strength required for this switching is less as a result of the temperature gradient-induced thermal spin current. Likewise, if an electrical spin current alone is used to switch the free layer, the electrical spin current required for this switching is less as a result of the temperature gradient-induced thermal spin current. Similarly, if a combination of a magnetic field and an electrical spin current is used to switch the free layer, a smaller magnetic field and a smaller electrical spin current are required.) The magnetic layers and the tunnel barrier are configured such that the tunneling conductance across the tunnel barrier is asymmetric with respect to bias voltage across the tunnel barrier.

Another aspect of the invention is a method that includes creating a temperature gradient across a tunnel barrier that separates a magnetic reference layer and a magnetic free layer, thereby inducing a thermal spin current across the tunnel barrier, in which the magnetic layers and the tunnel barrier form a magnetic tunnel junction. The method also includes switching the free layer with a magnetic field and/or an electrical spin current, in which the thermal spin current reduces the magnitude of the magnetic field and/or the electrical spin current required to switch the free layer. Furthermore, the magnetic layers and the tunnel barrier are configured such that the tunneling conductance across the tunnel barrier is asymmetric with respect to bias voltage across the tunnel barrier.

Yet another aspect of the invention is method that includes creating a temperature gradient across a tunnel barrier that separates a magnetic reference layer and a magnetic free layer, thereby inducing a thermal spin current across the tunnel barrier, in which the tunnel barrier and the magnetic layers form a magnetic tunnel junction. The free layer is brought into a precessional state through the use of a temperature gradient-induced thermal spin current across the tunnel barrier.

Another aspect of the invention is a method that includes creating a temperature gradient across a tunnel barrier that separates a magnetic reference layer and a magnetic free layer, thereby inducing a thermal spin current across the tunnel barrier, in which the tunnel barrier and the magnetic layers form a magnetic tunnel junction. The free layer is brought into a precessional state (i) through the use of a temperature gradient-induced thermal spin current across the tunnel barrier, in combination with (ii) an external magnetic field applied to the magnetic tunnel junction and/or an electrical spin current that flows across the magnetic tunnel junction.

BRIEF DESCRIPTION OF THE DRAWINGS

FIG. 1, which includes

FIG. 1a. (Top panel) Scanning Electron Micrograph (SEM) of a device designated "I" showing the free and reference layers of the MTJ along with its gold contacts and heater, which are also seen in the blow-up in the smaller box on the right. (Bottom panel) Cross-section Transmission Electron Micrograph (X-TEM) showing from bottom to top: MgO (100) substrate, the vertical magnetic stack (shown in greater detail in the blow-up in the smaller box on the right), the 30 nm thick top Au layer (which contacts the free layer of the vertical magnetic stack), the 20 nm thick AlOx isolation pad, and the 20 nm thick ScN heater.

FIG. 1b. Schematic showing the various components of device I, the electrical measurement circuit in the closed-circuit configuration, and the heat flow direction (indicated by the arrow to the left of the schematic).

FIG. 1c COMSOL model built from the SEM and TEM information of the device I of FIG. 1a, for the case $I_{Heater}=0.15$ mA. The results of the COMSOL model for this and other values of $I_{Heater}$ are used to generate the simulations shown in FIGS. 1d and 1e.

FIG. 1d The temperature profile for $I_{Heater}$ is taken along the z-axis of the entire device and centered on the MTJ (see the vertical, dashed arrow of FIG. 1c). The inset in FIG. 1d shows the temperature profile across the magnetic electrodes and the tunnel barrier, corresponding to z indicated by the shaded region between 125 and 150 nm.

FIG. 1e. The temperature profile of the bottom reference layer (RL, z=142 nm) along the x-axis used for thermometry (see the horizontal, dashed line in FIG. 1c).

FIG. 2, which includes

Figure 2A:
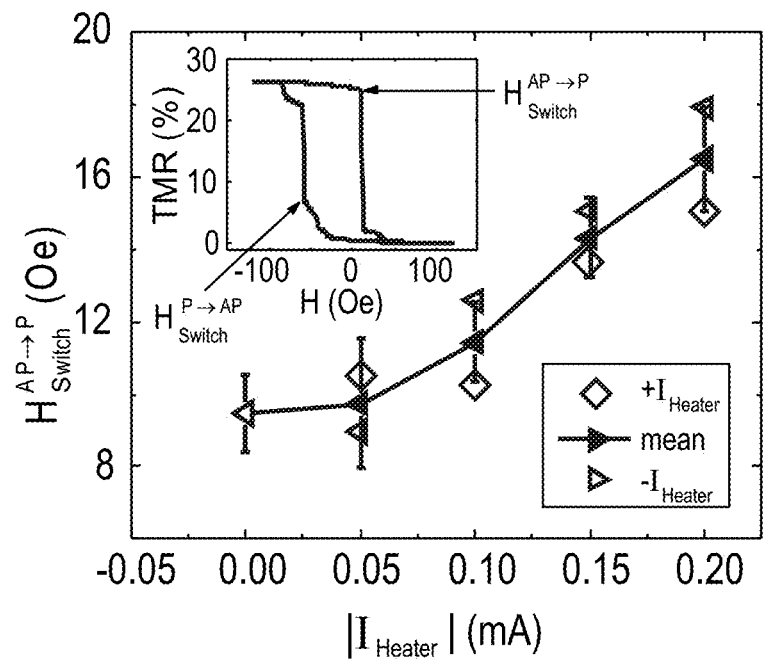
FIGS. 2a, 2b, 2c, 2d, 2e, and 2f: MTJ switching measurements and local thermometry for device I FIG. 2a (Inset) TMR of device I at 10 K with the H indicated.
Figure 2B:
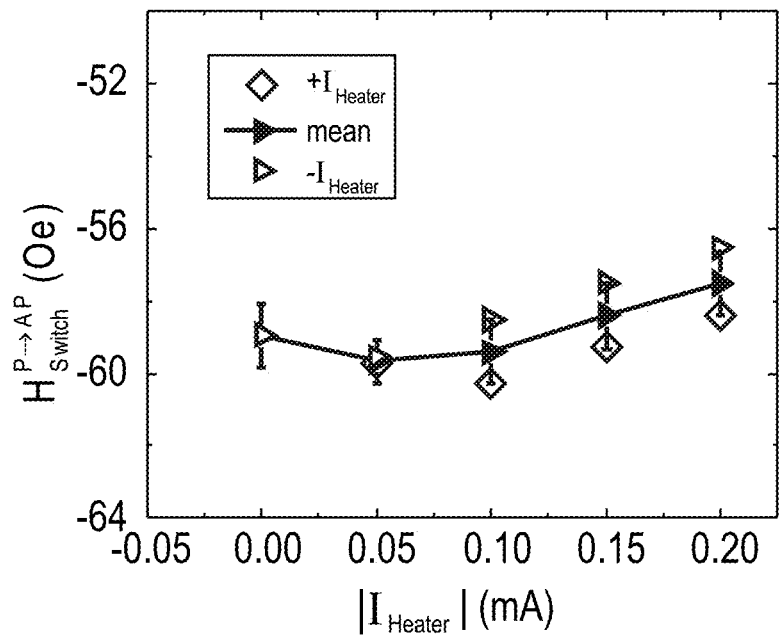

$H_{switch}^{AP \rightarrow P}$ and $H_{switch}^{P \rightarrow AP}$ plotted as a function of $I_{Heater}$ in the main portion of FIG. 2a and FIG. 2b, respectively.

Figure 1A:
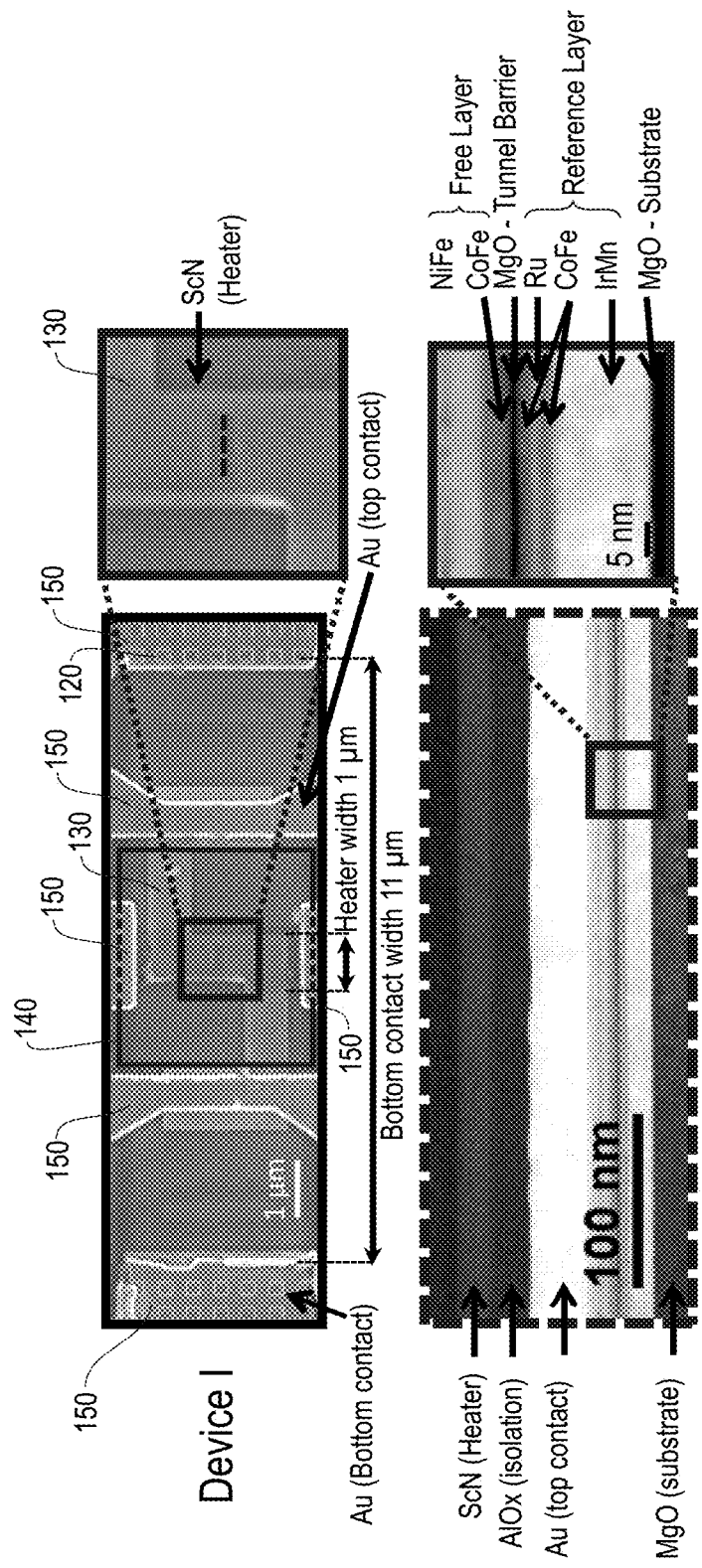
FIGS. 1a, 1b, 1c, 1d, and 1e: Device geometry
Figure 1B:
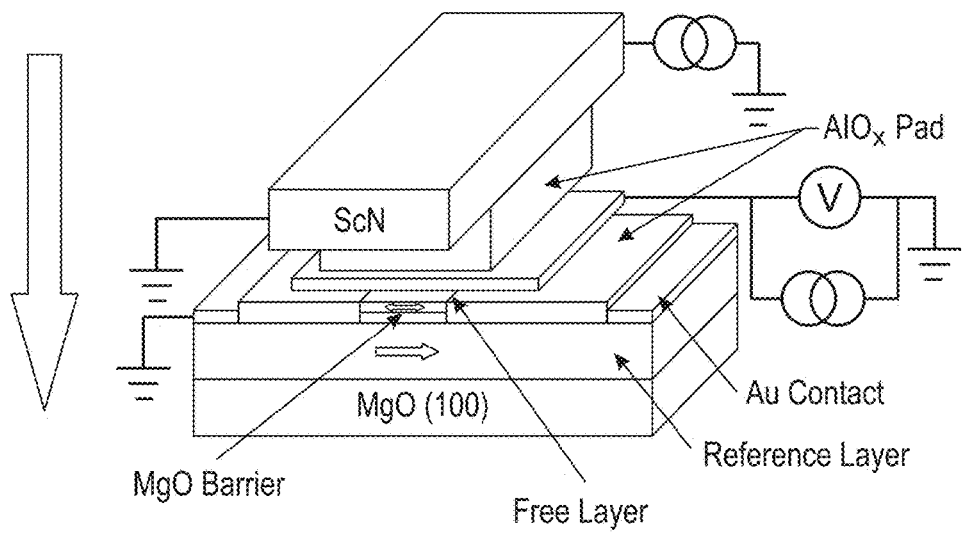
Figure 1C:
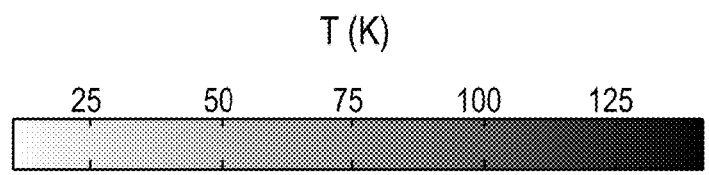
Figure 1C:
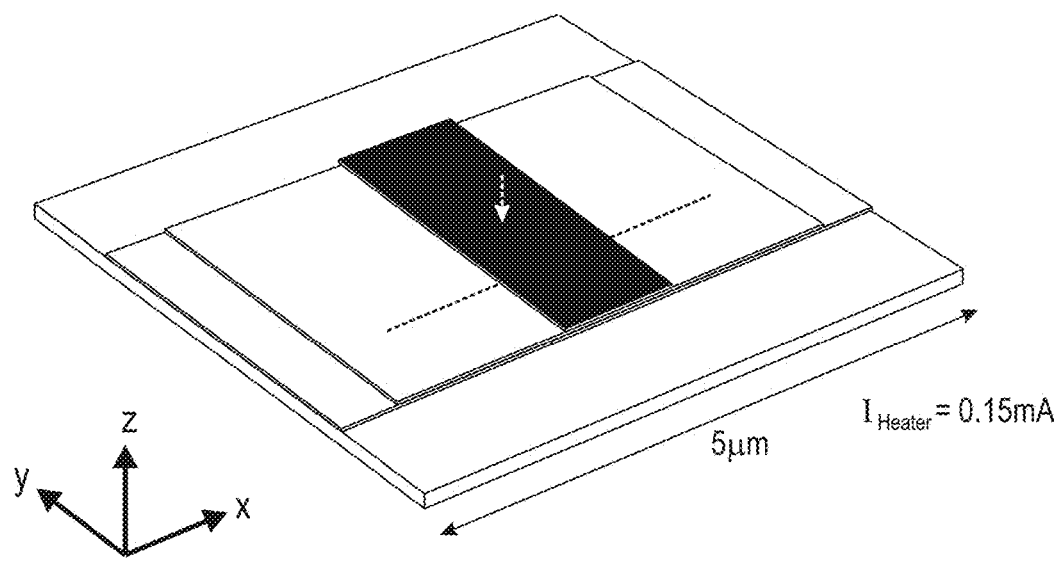
Figure 2C:
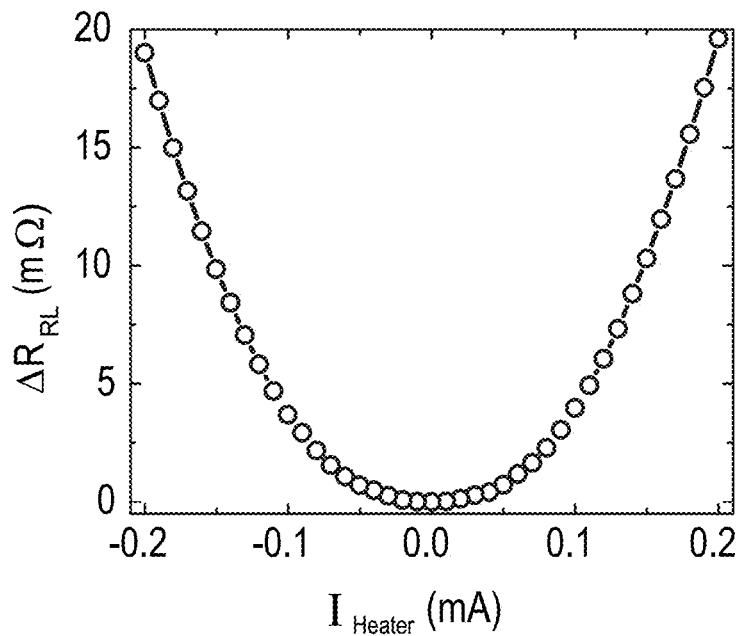
Figure 2D:
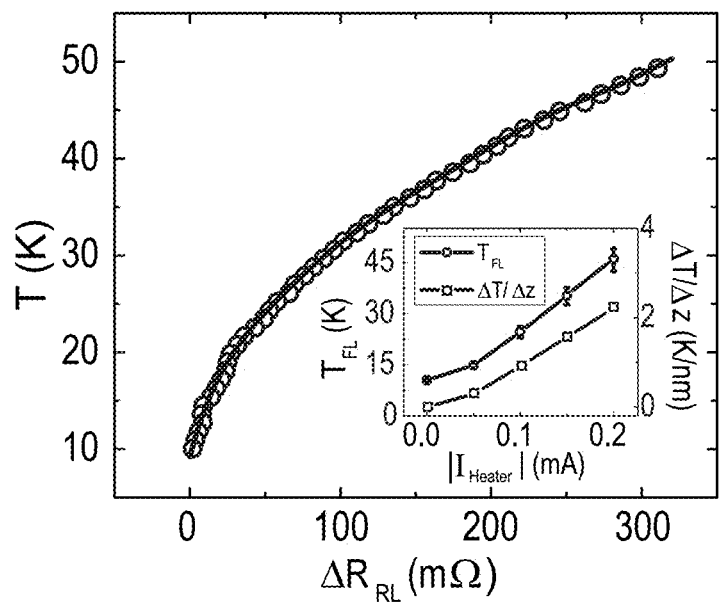

FIGS. 2c and 2d show (i) RL resistance change as a function of heater current: $\Delta R_{RL}(I_H)$ and (ii) temperature as a function of RL resistance change: $T(\Delta R_{RL})$, respectively, which are used together to estimate $T(I_{Heater})$ with an appropriate scaling factor, as shown in the inset of FIG. 2d—also shown in this inset is $\Delta T/\Delta z$, which is obtained from the COMSOL model of FIG. 1c.

Figure 2E:
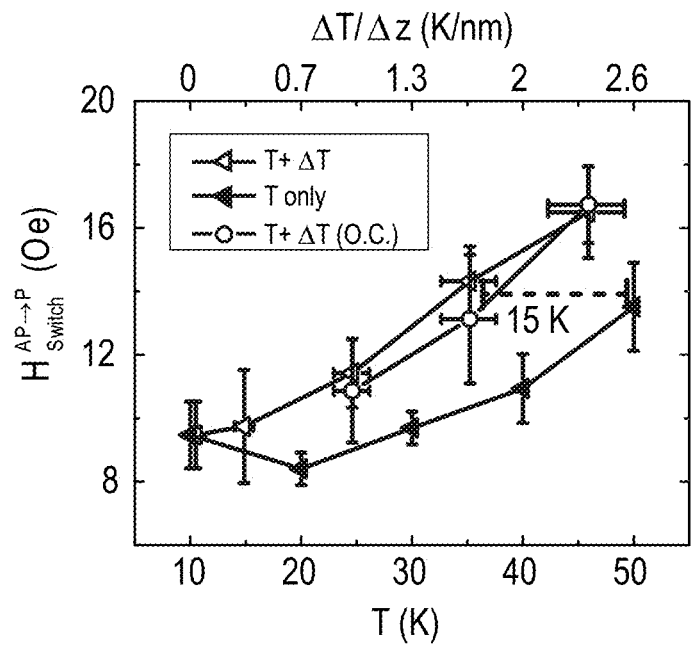
Figure 2F:
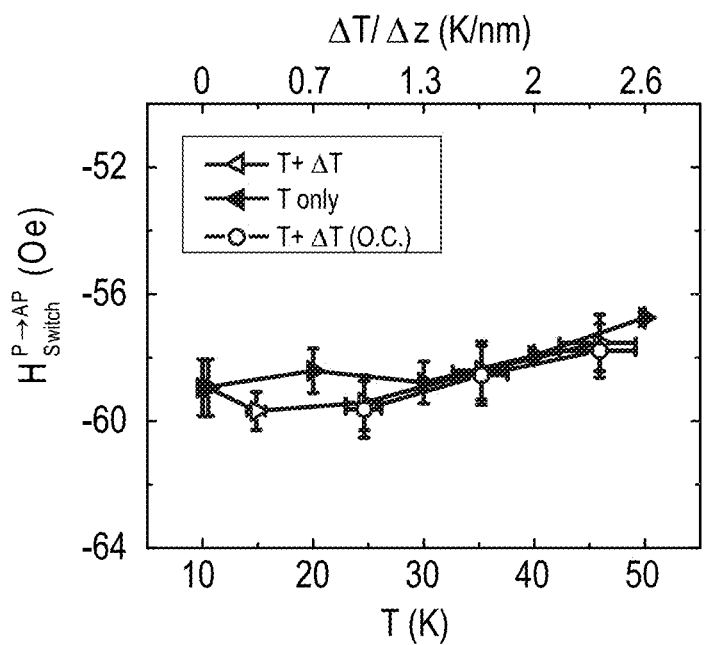

$T(I_{Heater})$ is then used in FIGS. 2e and 2f to plot $H_{switch}(T+\Delta T)$ along with independently measured $H_{switch}(T)$ for AP→P and P→AP switching. The open circles indicate $H_{switch}(T+\Delta T)$ in an open circuit (O.C.) configuration, which is discussed further below in connection with FIG. 4.

Figure 3A:
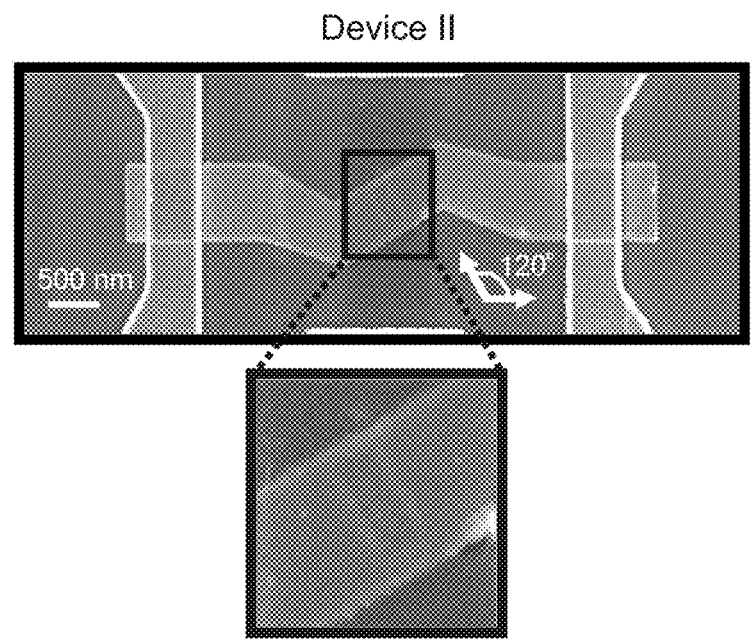
Figure 3B:
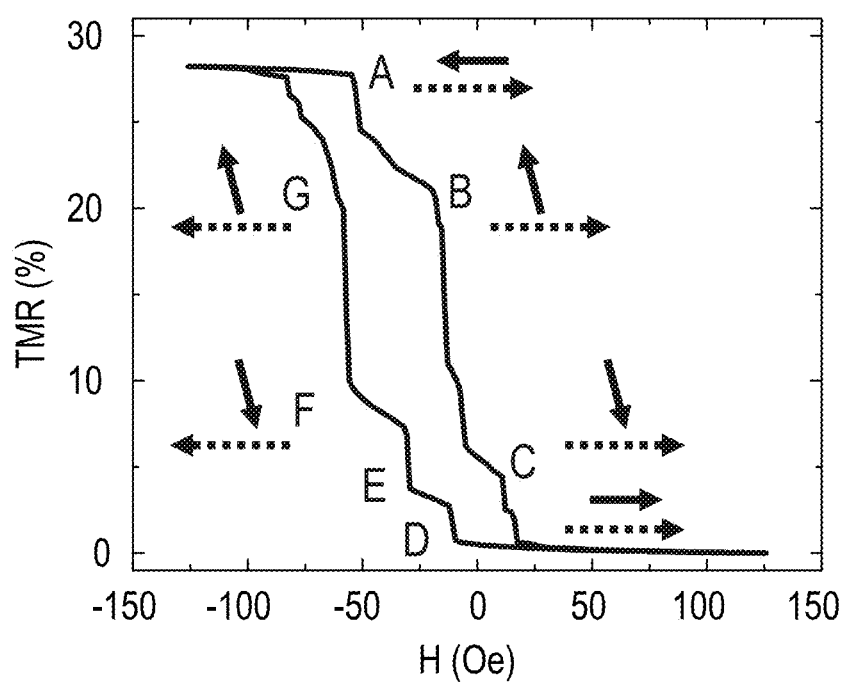
Figure 3C:
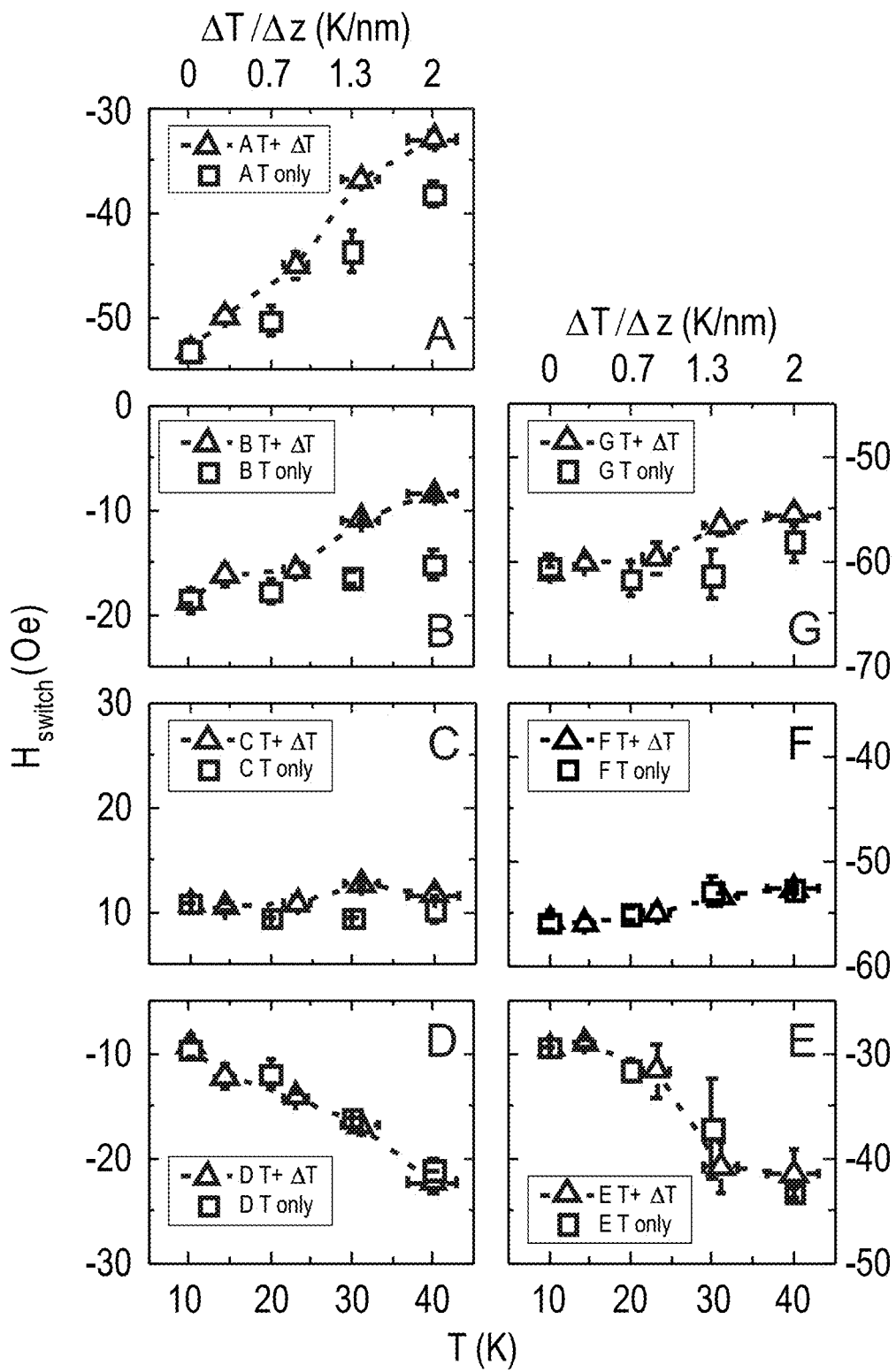

FIG. 3, which includes FIGS. 3a, 3b, and 3c: MTJ switching measurements for a device designated "II", having the same dimensions as device I.

FIG. 3a SEM of device II with the FL oriented at 120° to the RL.

FIG. 3b. TMR of device II along with different FL magnetization orientations with respect to RL (labeled A through G; see the corresponding arrows for a pictorial approximation of the relative magnetic alignment).

FIG. 3c. $H_{switch}(T+\Delta T)$ and $H_{switch}(T)$ for orientations A, B and G, where evidence of $\Delta T(I_{Heater})$ induced spin currents effects are observed. $H_{switch}(T+\Delta T)$ and $H_{switch}(T)$ for orientations C, D, E and F, where $H_{switch}(T+\Delta T)$ and $H_{switch}(T)$ track each other, implying no $\Delta T(I_{Heater})$ induced spin currents effects, while also confirming the temperature estimation procedure.

FIG. 4, which includes FIGS. 4a, 4b, 4c, 4d, and 4e: Magneto-Seebeck measurements of devices I and II.

Figure 4A:
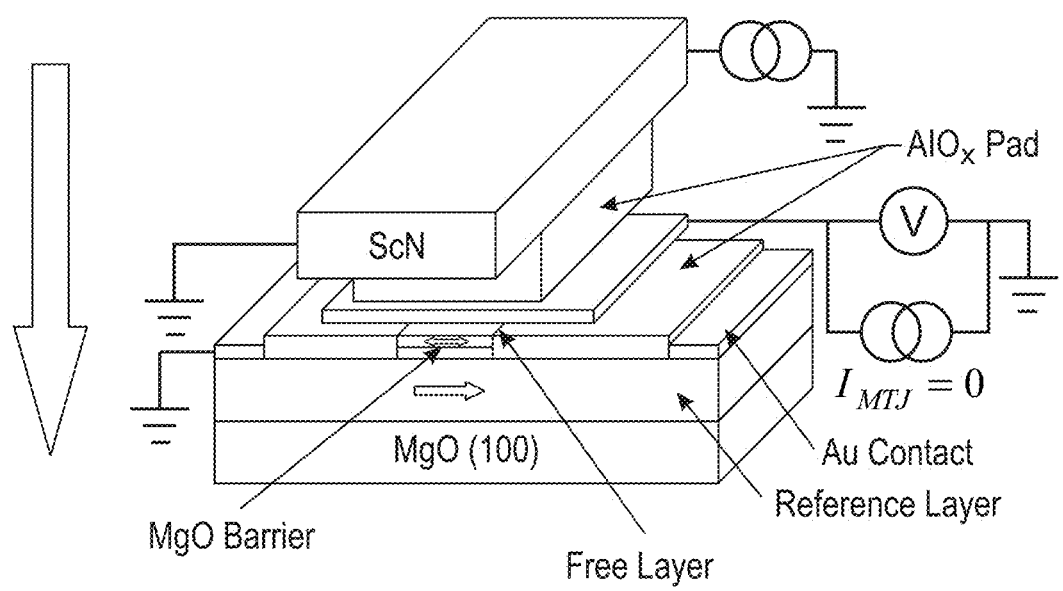

FIG. 4a. Schematic showing the open-circuit (O.C.) measurement configuration (i.e., when $I_{MTJ}=0$) used in collecting the data of FIGS. 4b, 4c, 4d, and 4e (as well as FIGS. 2e, 2f, 7c, and 7d).

Figure 4B:
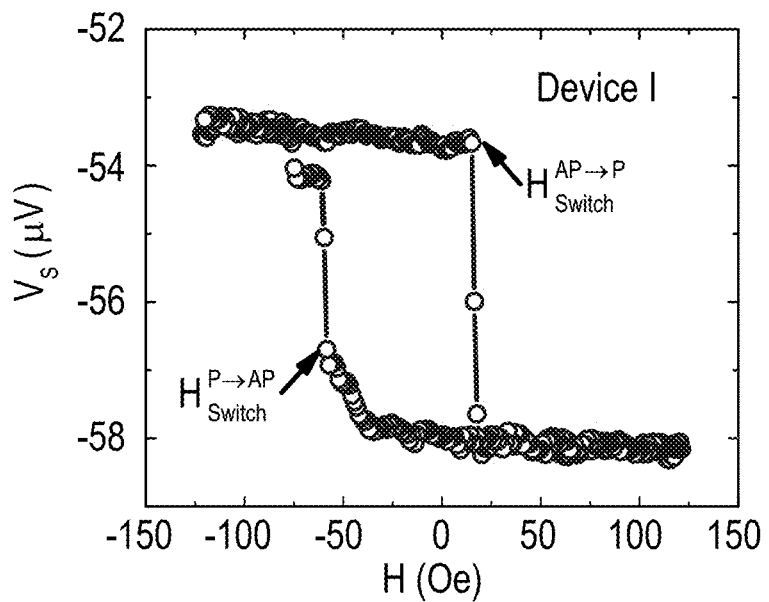
Figure 4C:
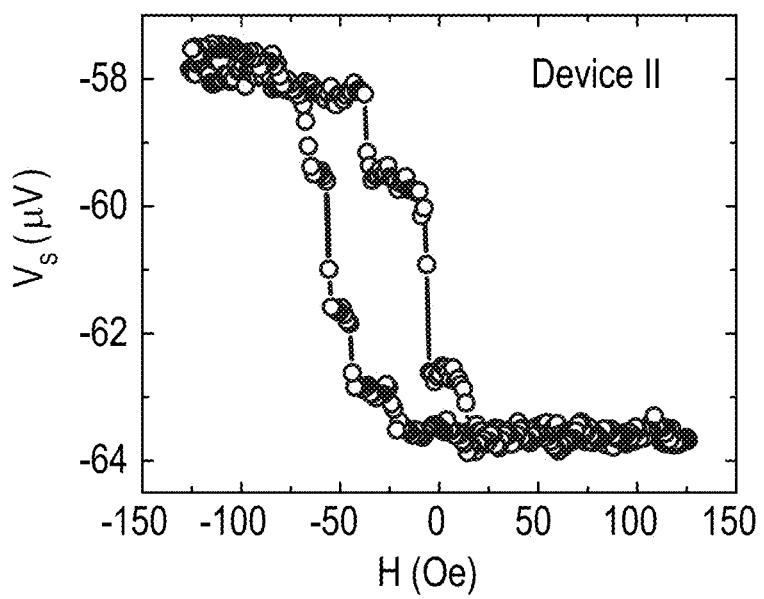

FIGS. 4b and 4c. Seebeck voltage, $V_S$, as a function of H for $I_{Heater}=+0.2$ mA for devices I and II, respectively.

Figure 4D:
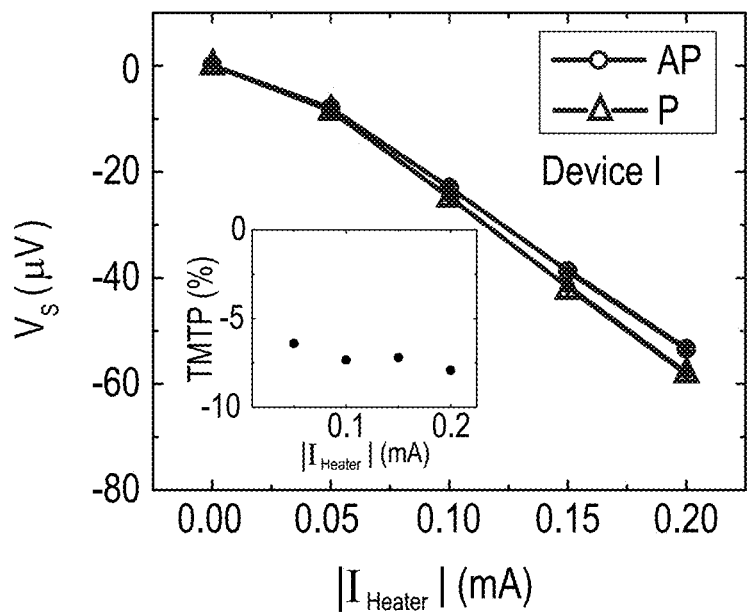
Figure 4E:
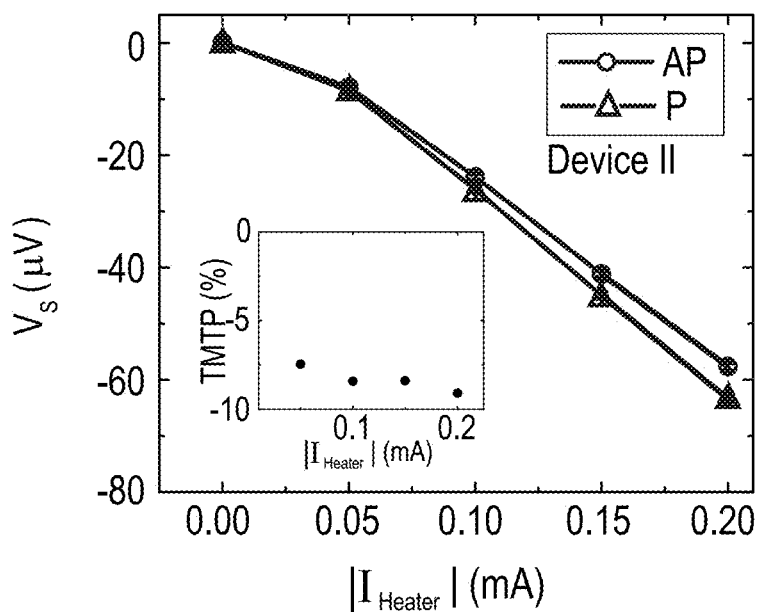

FIGS. 4d and 4e. $V_S$ as a function of $I_{Heater}$ in the AP and P configuration of the devices I and II, respectively. The tunneling magneto-thermopower (TMTP) ratio is defined as $$\frac{V_S^{AP} - V_S^P}{V_S^{AP}}.$$

Figure 5:
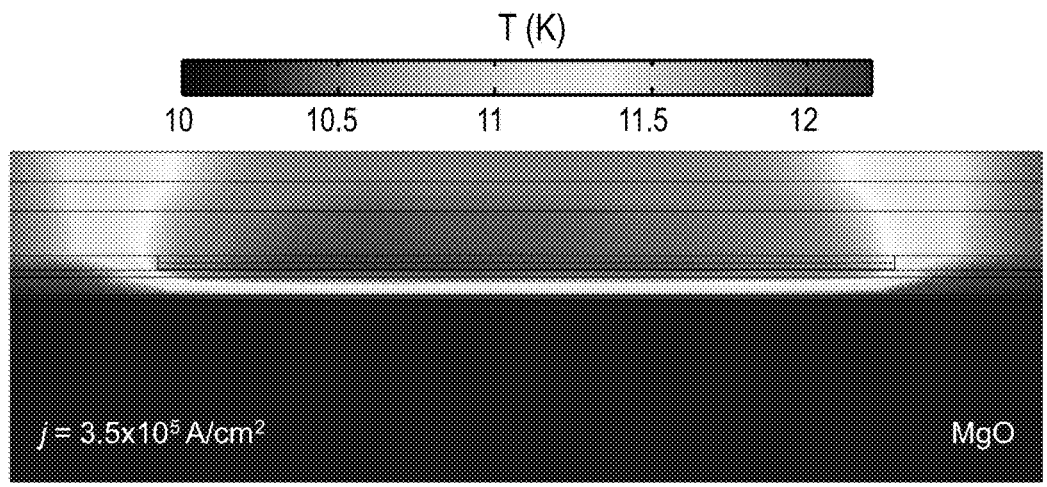

FIG. 5. Device temperature distribution for current across device I.

(Bottom) The table shows the temperature at the top and bottom layer of the MgO tunnel barrier as a function of current density j. (Top) The temperature plot corresponds to the case of $j=3.5\times10^5$ A/cm$^2$.

FIG. 6, which includes FIGS. 6a, 6b, 6c, 6d, 6e, and 6f: Switching field dependence with STT for device I.

Figure 6A:
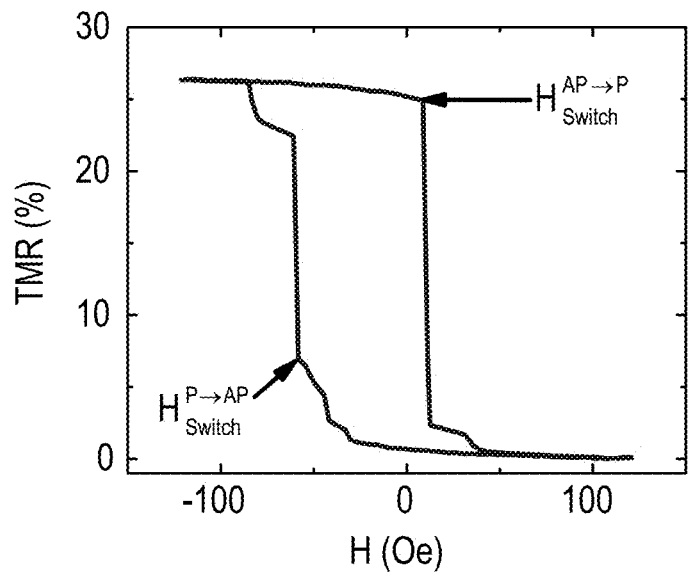

FIG. 6a. Low current TMR curve at 10 K.

Figure 6B:
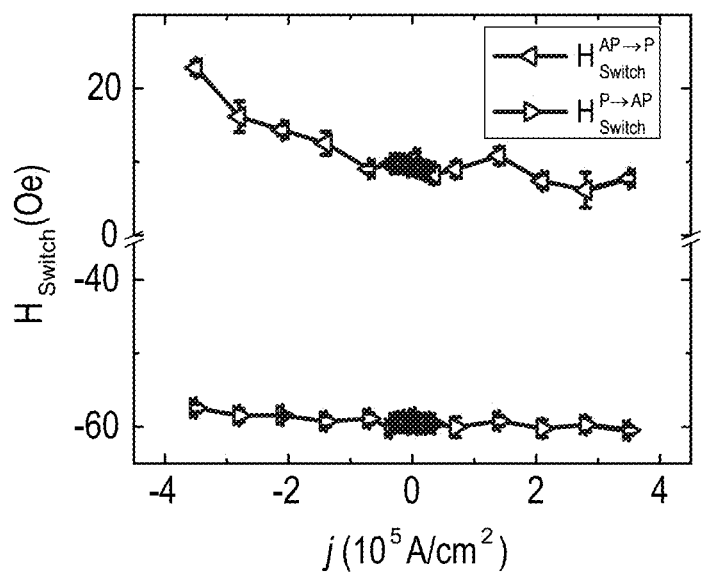

FIG. 6b. $H_{switch}^{AP \rightarrow P}$ and $H_{switch}^{P \rightarrow AP}$ as a function of current density j across the MTJ.

Figure 6C:
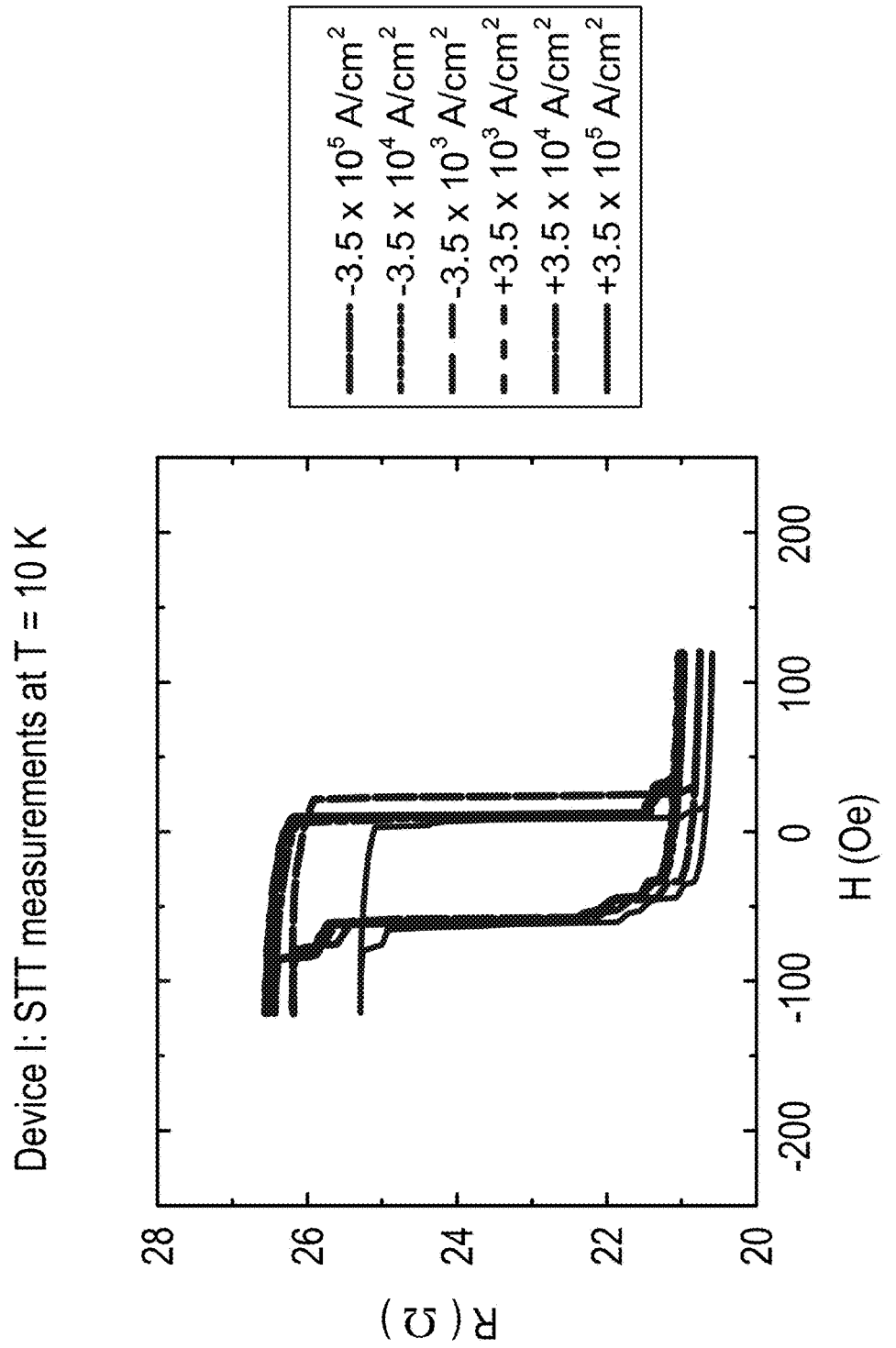

FIG. 6c. Resistance R of the MTJ as a function of magnetic field corresponding to different current densities across the MTJ.

Figure 6D:
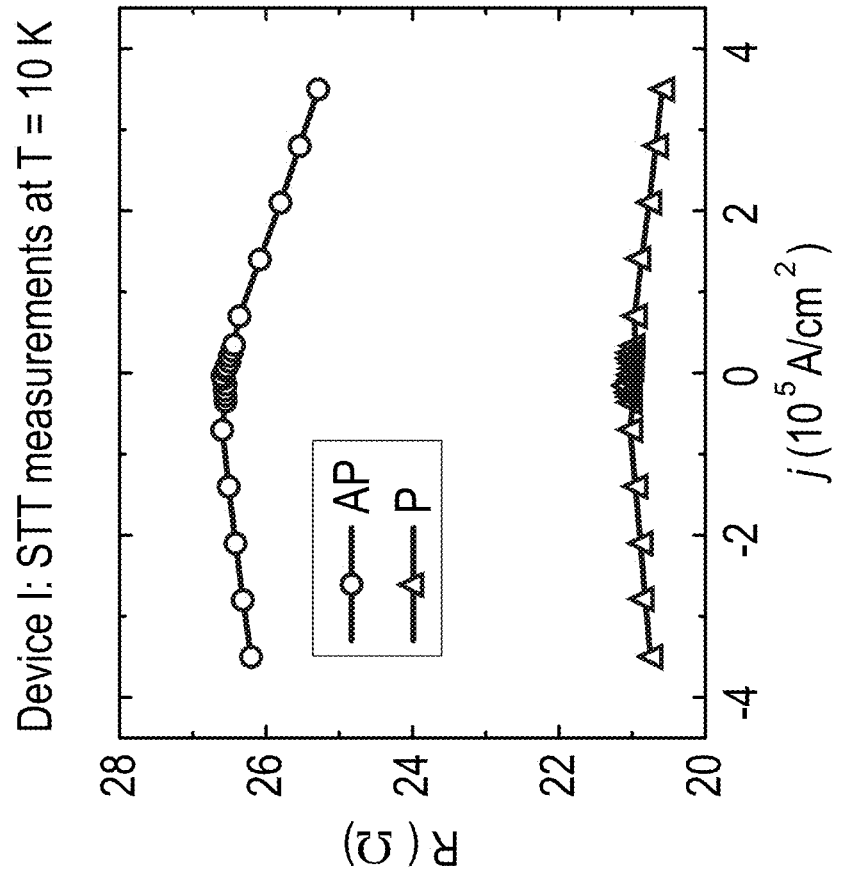

FIG. 6d. R of the MTJ in the AP and P state for different j.

Figure 6E:
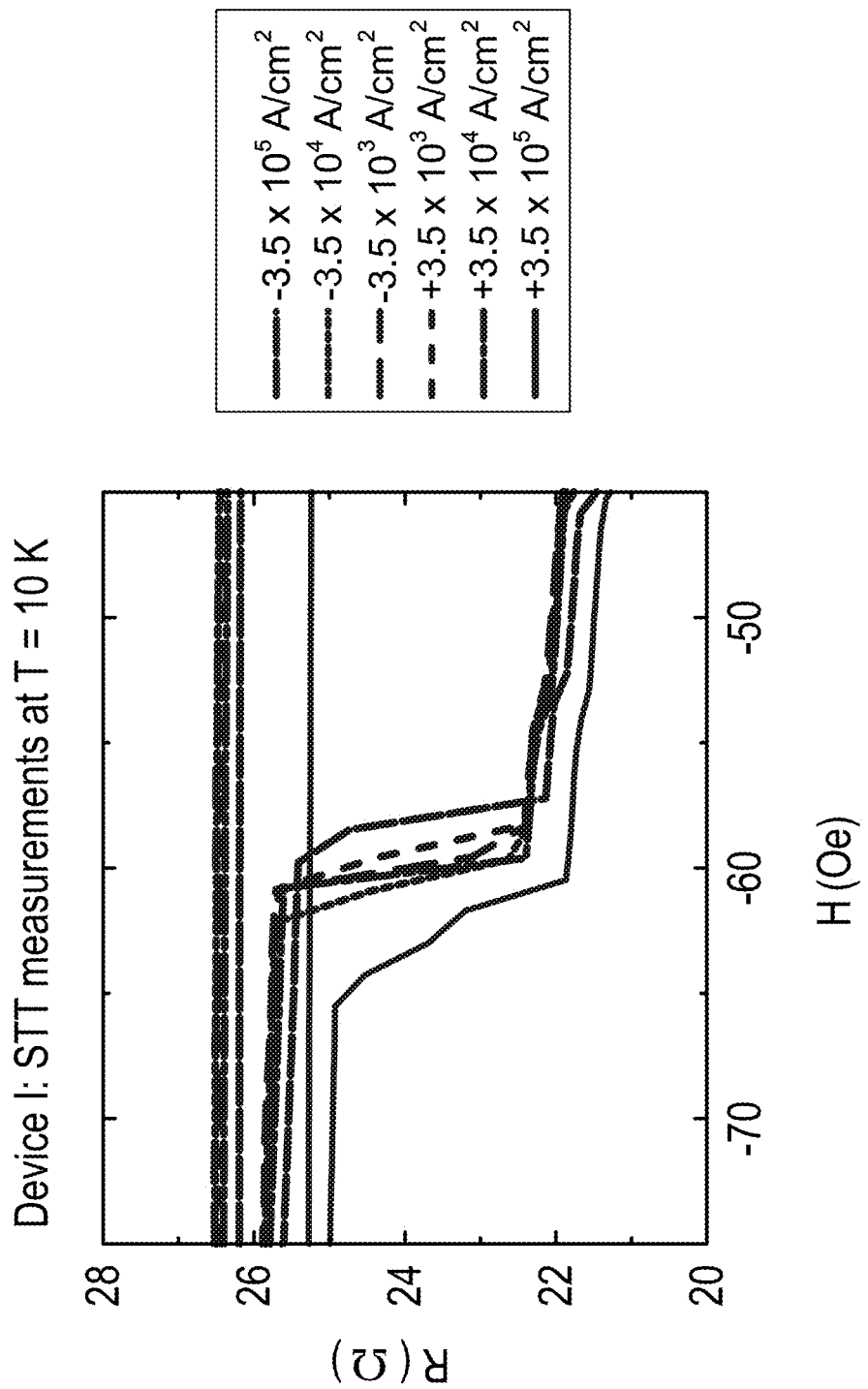
Figure 6F:
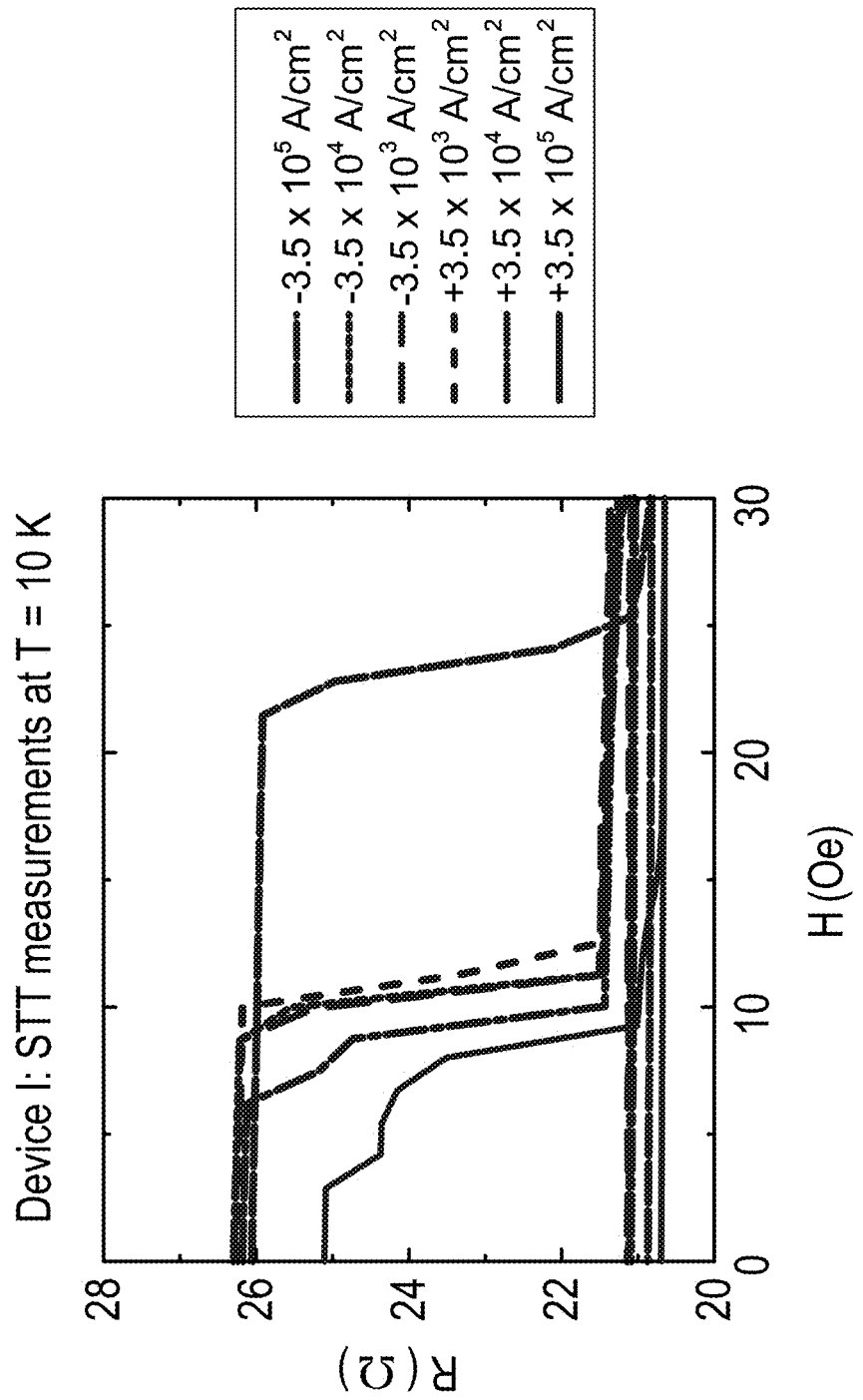

FIGS. 6e and 6f. Expanded views of portions of FIG. 6c of the P→AP and AP→P switching of the MTJ, respectively, for different j.

FIG. 7, which includes FIGS. 7a, 7b, 7c, 7d, 7e, and 7f: Origin of the TST

Figure 7A:
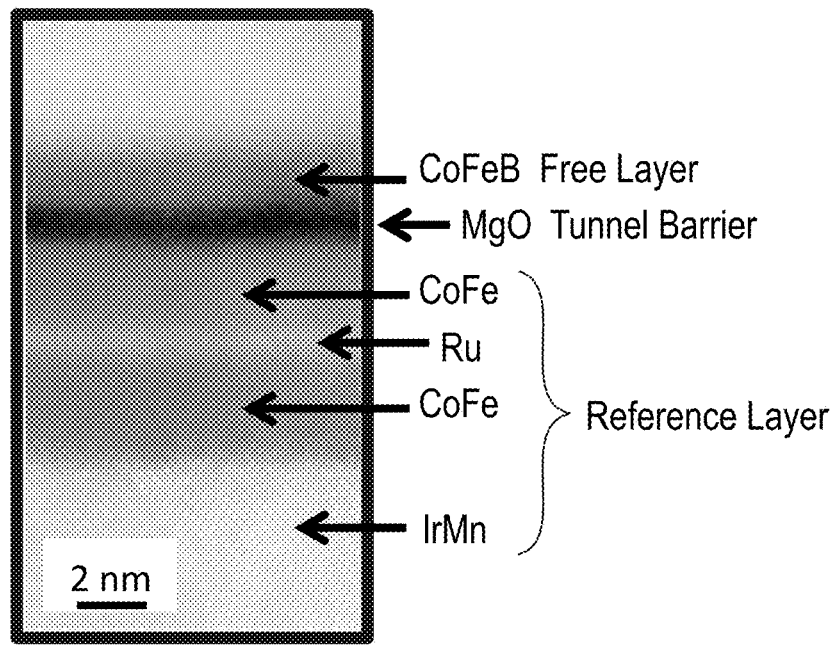

FIG. 7a. TEM of a device designated "III", showing the 1 nm thick MgO tunnel barrier. The FL of the MTJ is 185 nm long and 65 nm wide, whereas the RL has the same dimensions as devices I and II.

Figure 7B:
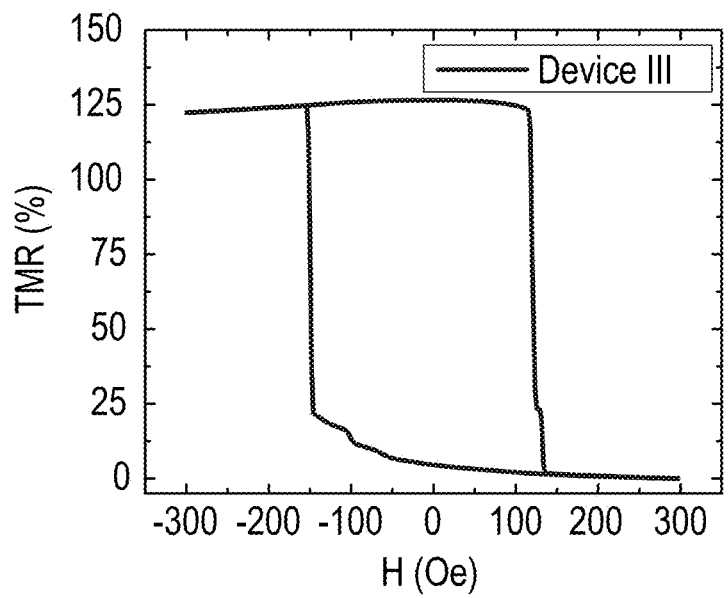

FIG. 7b. TMR of device III. $H_{switch}$ is larger for device III because of the smaller dimensions of its FL; the TMR is higher because different magnetic electrodes are used as shown in FIG. 7a.

Figure 7C:
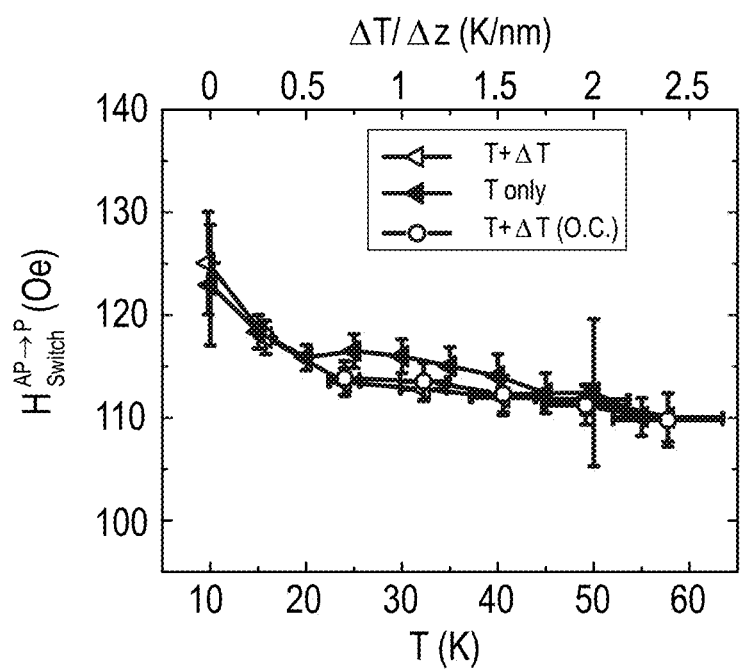
Figure 7D:
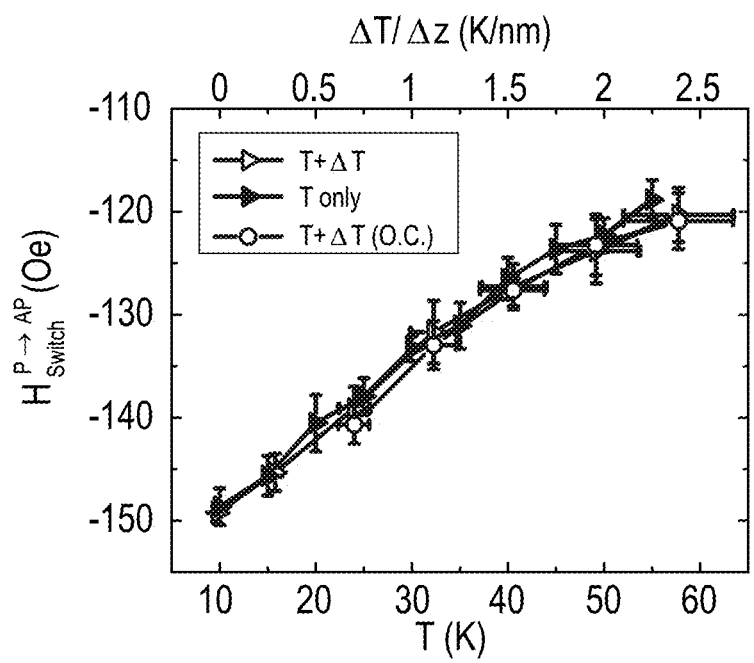

FIGS. 7c and 7d. $H_{sw}(T+\Delta T)$ along with independently measured $H_{switch}$ (T) for AP→P and P→AP switching for device III. The open circles indicate $H_{switch}(T+\Delta T)$ in an open circuit (O.C.) configuration as discussed in connection with FIG. 4.

Figures 7E, 7F:
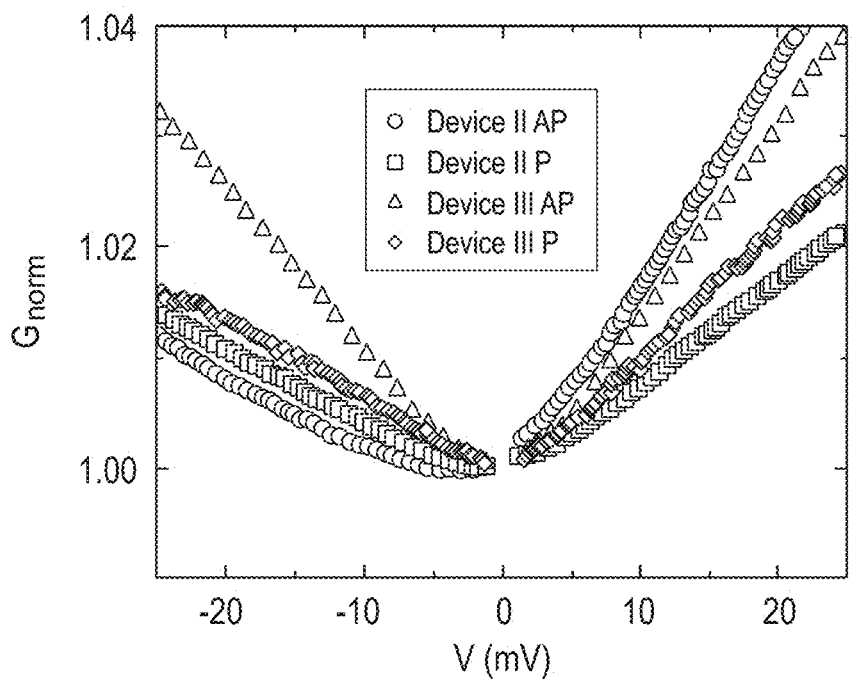

FIG. 7e $G_{norm}$ (normalized conductance) for devices II and III in AP and P states. Data near V=0 have been taken out.

FIG. 7f TST is present whenever there is a strong asymmetry in $G_{norm}$ across V=0, as summarized in this table.

FIG. 8, which includes FIGS. 8a, 8b, 8c, 8d, and 8e: Conductance asymmetry consistent with minority spins of the RF accumulating into the FL.

Figure 8A:
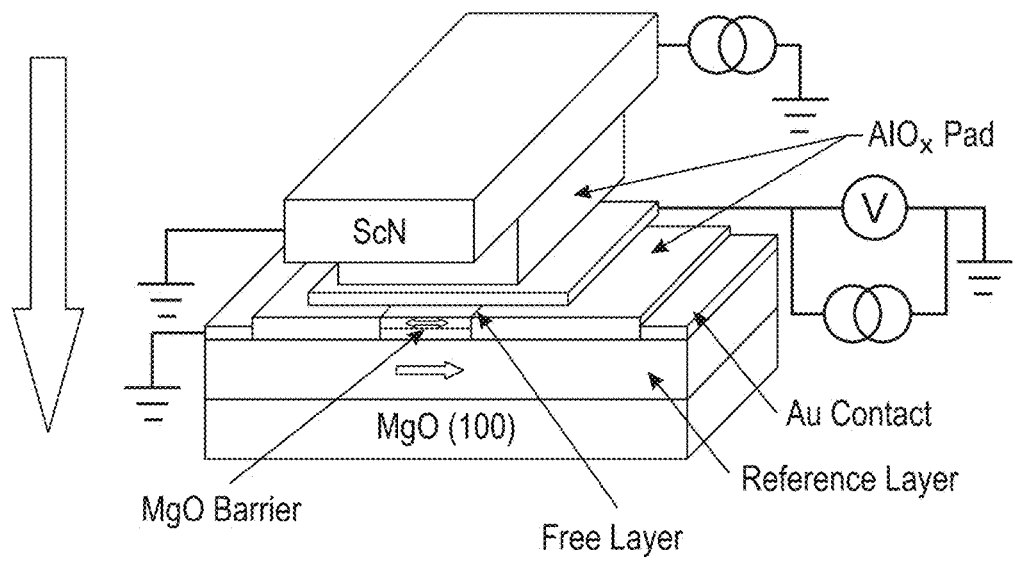

FIG. 8a. The device schematic showing the RL connected to ground, while voltage bias is measured at the FL by sourcing a current across the MTJ.

Figure 8B:
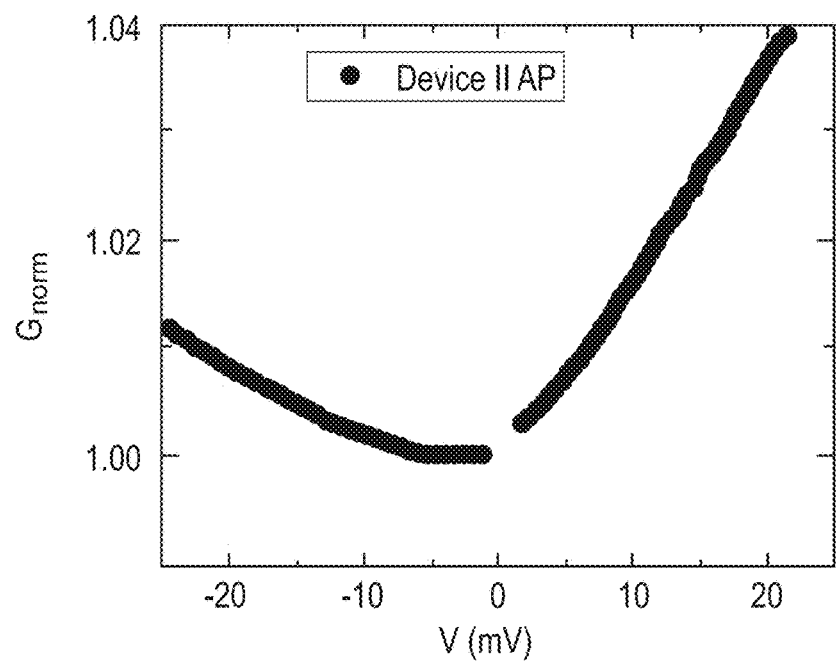
Figure 8C:
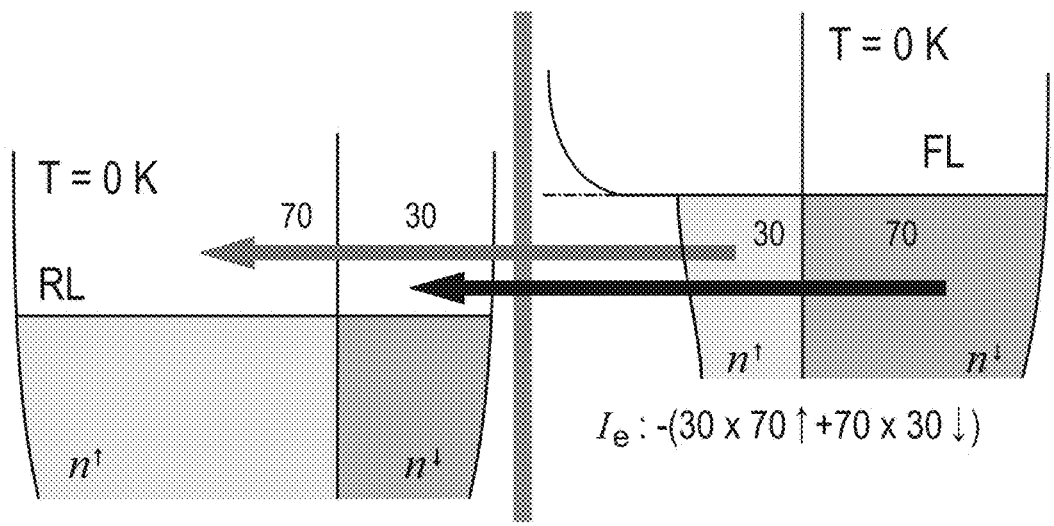
Figure 8D:
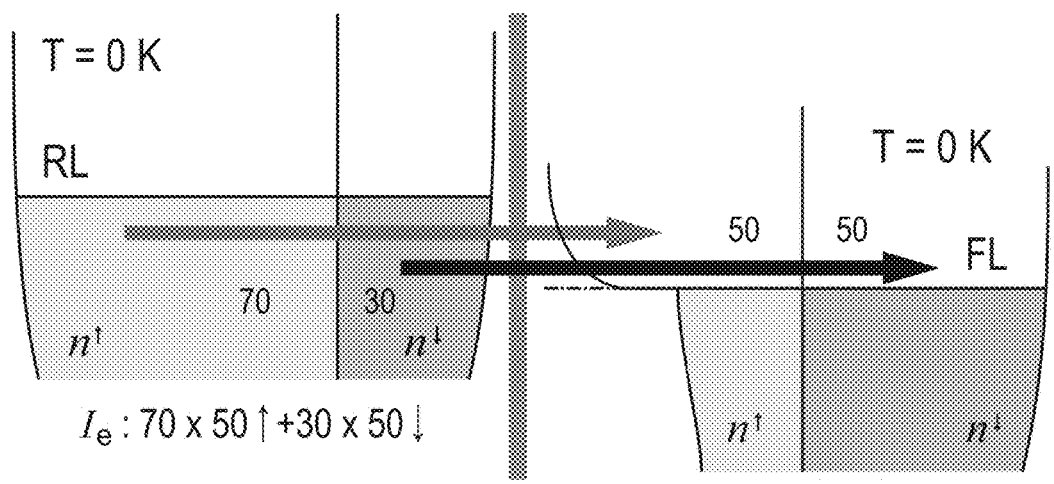
Figure 8E:
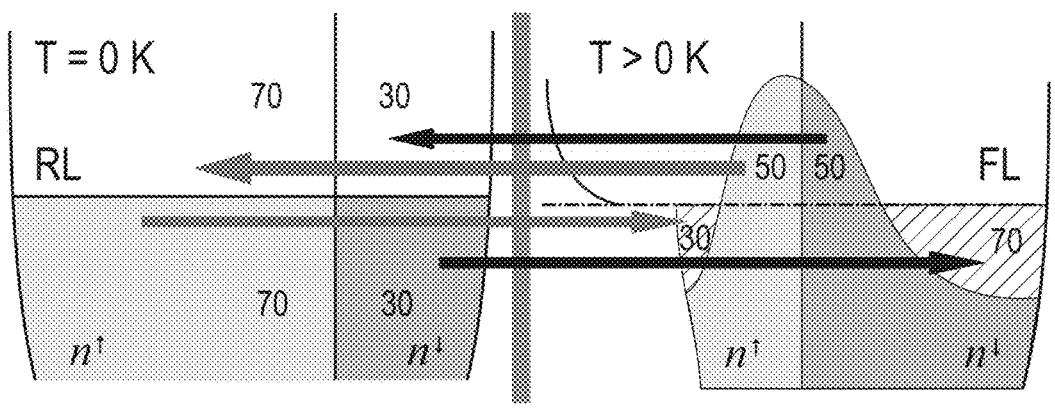

FIG. 8b. Asymmetric normalized conductance $G_{norm}(V)=G(V)/G(V=0)$ characteristic near zero bias. One way to account for the asymmetry is by changing the polarization of the FL as depicted in FIGS. 8c-8e. (FIG. 8c represents the case of negative bias, whereas FIG. 8d represents the case of positive bias.) The tunnel current is ascertained by taking a convolution of the spin-dependent occupied density of states (DOS) in one magnetic electrode with the spin-dependent unoccupied DOS of the other electrode, without considering any spin flip. The numbers '70', '30', '50' in the band structure indicate the relative density of states (DOS) for the two spins as a function of energy. These numbers are just for illustration purposes and do not indicate the actual relative polarization. $I_e$ and $I_s$ indicate the calculated charge and spin currents.

FIG. 8e depicts the situation in which the FL is heated without applying any voltage across the MTJ. This leads to a temperature gradient across the MTJ that induces a net spin ↓ current in the FL, thereby increasing the switching field $H_{switch}^{AP \to P}$ as is observed experimentally.

DETAILED DESCRIPTION

FIG. 1 illustrates aspects of our experimental setup, which includes an MgO based MTJ (25, 26) grown by magnetron sputtering on a thermally conducting MgO (100) substrate, with the sequence of layers from bottom to top being: 12.5 IrMn|2 CoFe|0.8 Ru|1.8 CoFe|0.9 MgO|1 CoFe|3 NiFe|5 Ru. (Here the numbers represent film thicknesses in nanometers.) The following discusses fabrication of the device.

First, a large mesa of 3 µm×20 µm is formed by etching portions of the film stack down to the MgO (001) substrate. To this end, Ar ion milling is performed followed by in situ side-wall encapsulation with alumina ($AlO_x$). Next, a free layer (FL) of appropriate size and orientation is exposed by etching in the center of the large mesa down to the MgO tunnel barrier, while also making a series of additional mesas 120 at both ends, with the mesa serving as the bottom contact to the tunnel junction. Specifically, Ar ion milling of portions of the large mesa is performed down to the MgO tunnel barrier (an in situ residual gas analyzer is used to determine which layer of the film stack is being etched the during Ar ion milling process), and thereafter $AlO_x$ is deposited in situ for MTJ side-wall encapsulation. A 30 nm thick S-shaped gold layer 130 is then deposited, which serves as the top contact to the FL. Another 20 nm thick alumina pad 140 is deposited to encapsulate the underlying FL and its gold contact, thereby providing electrical isolation between the top contact of the MTJ and the heater (to be formed next). Thereafter, a 20 nm thick layer of ScN with resistivity ~2 mΩ-cm is deposited, which serves as the heater. Six large Au contacts 150 are then deposited to connect to each of the top and bottom electrodes of the MTJ and to the heater.

The FL is 200 nm wide and 500 nm long, whereas the RL of the MTJ is of considerably larger proportions (3 µm wide and 11 µm long) and serves as an on-site thermometer to measure the local temperature of the MTJ upon heating. As mentioned above, a 1 µm wide resistive heater (resistivity ~2 mΩ-cm) made of ScN is deposited above the MTJ and is electrically isolated from the top contact of the MTJ by a 20 nm thick alumina ($AlO_x$) pad. The advantage of this geometry is that effects on the MTJ switching due solely to thermal gradients can be studied in the closed-circuit configuration (FIG. 1b) with minimal sensing current through the MTJ, $I_{MTJ}$ (=10 µA; current density $\sim 10^4$ $A/cm^2$), thereby negating any conventional STT or self-heating effects through the MTJ.

In order to create sharp temperature gradients with little heat input, experiments were performed at a base temperature of 10 K, which has several advantages. Firstly, the heat capacity of the entire device at this temperature is 2-3 orders of magnitude smaller than it is at room temperature, i.e., less heat is required to raise the temperature by a given amount. Secondly, the thermal conductivity of oxides is a few orders of magnitude lower at low temperatures than at room temperature, thereby leading to larger temperature gradients across the tunnel barrier for a given heat current. Thirdly, the resistivity of the semiconducting ScN heater is higher at lower temperatures, thereby requiring a smaller heater current, $I_{Heater}$, to generate the same amount of heat. Finally and most importantly, the highest temperatures of the FL of the MTJ (<60 K) accessed in our experiments change the saturation magnetization of the FL by less than 1% of its lowest temperature value.

The change in the resistance of the MTJ (device I) as the magnetic field is applied to switch the FL (i.e., the tunneling magneto-resistance or TMR) is plotted in FIG. 2a (inset). The resistance of the MTJ when the FL is parallel to the RL—the parallel (P) configuration—is lower than the resistance when the FL is anti-parallel to the RL (AP configuration). Characteristic switching fields ($H_{switch}$) required to switch the FL from the P to AP configuration ($H_{switch}^{P \to AP}$) and vice versa ($H_{switch}^{AP \to P}$) are indicated in the inset of FIG. 2a.

Figure 1D:
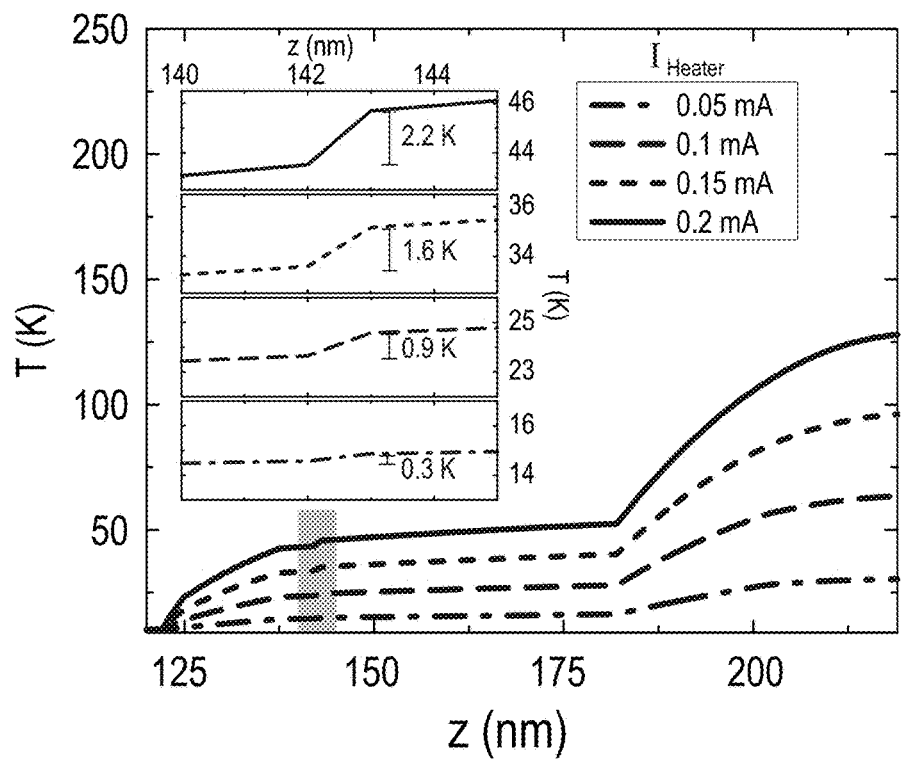
Figure 1E:
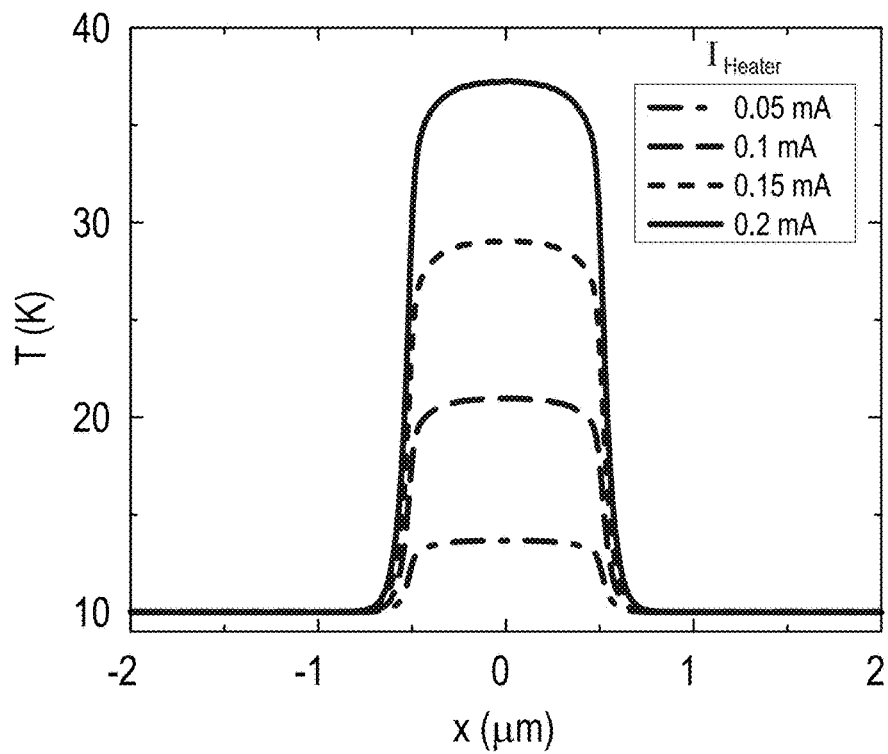

The TMR measurement can now be performed at 10 K while locally heating the MTJ with a current through the heater, $I_{Heater}$, thereby creating sharp temperature gradients on the order of 1 K/nm across the tunnel barrier (transverse) and 0.1 K/nm along the length of the RL (longitudinal), as shown in the finite element model (FIG. 1c-e). We observe experimentally that $H_{switch}^{P \to AP}$ and $H_{switch}^{AP \to P}$ systematically change as a function of $I_{Heater}$ (see the data of FIGS. 2a and 2b). Owing to the choice of a highly resistive heater, minimal current densities ($<1 \times 10^6$ $A/cm^2$) are required through the heater to create such sharp temperature gradients, which lead to small fringing magnetic fields (<2 Oe) at the FL of the junction. This magnetic field offset can be corrected for by measuring $H_{switch}$ at different times using opposite polarities of $I_{Heater}$ (since opposite polarities of $I_{Heater}$ give rise to fringing fields of opposite orientation, so that the respective contributions to the total switching magnetic field are cancelled).

Creation of sharp temperature gradients ($\Delta T/\Delta z$) is necessarily associated with an increased absolute temperature of the MTJ. To minimize the net increase of the absolute temperature, the MTJ stack is grown on a thermally conducting substrate, i.e., MgO (100), which acts as a heat sink for the bottom electrode of the MTJ. $H_{switch}$ also depends on the absolute temperature T of the MTJ as shown by the data of FIGS. 2e and f. Hence, in order to ascertain the TST contributions to MTJ switching, it is essential to compare (i) the switching fields, $H_{sw}(T+\Delta T)$, measured with the temperature gradient generated from local heating with (ii) the switching fields, $H_{sw}(T)$ measured at elevated device temperatures, where no temperature gradients ($I_{Heater}=0$; $\Delta T=0$) exist.

We use local thermometry data (see FIGS. 2c and d), specifically $R_{RL}$ measured as a function of $I_{Heater}$, $R_{RL}$ ($I_{Heater}$), and also as a function of temperature $R_{RL}(T)$, to estimate the local temperature of the MTJ with ~5 K accuracy. First, we measure the resistance change of the RL of the MTJ as a function of $I_{Heater}$, i.e., $\Delta R_{RL}(I_{Heater})=R_{RL}(I_{Heater})-R_{RL}(I_{Heater}=0)$ at the base temperature of 10 K (FIG. 2c). Secondly, we calibrate our device 'thermometer' by measuring $\Delta R_{RL}(T)=R_{RL}(T)-R_{RL}(T=10K)$ as a function of temperature T and then invert the function to obtain $T(\Delta R_{RL})$ as shown in FIG. 2d. As the heater, which is 1 µm wide, heats only a section of the RL of the MTJ, which is 11 μm wide (see FIGS. 1a and c), we can estimate the temperature of the MTJ by first scaling $\Delta R_{RL}(I_{Heater})$ by an appropriate scale factor before looking up the temperature for the scaled $\Delta R_{RL}$ from FIG. 2d, as shown in the inset of FIG. 2d. (In this inset, the upper curve is derived directly from experimental measurements, whereas the lower curve is obtained from the COMSOL model discussed in connection with FIG. 1.) It may be noted that even though the temperature gradients that are created across the tunnel barrier are very large (~1 K/nm), the absolute temperature difference across the magnetic part of the stack is less than 5 K.

Comparing (see the data of FIGS. 2e and f) the $H_{switch}(T)$ at elevated temperatures with the corresponding $H_{switch}(T+\Delta T)$ measured at the base temperature (10 K) for different $I_{Heater}$ scaled to the appropriate temperatures (derived from the inset of FIG. 2d) shows evidence of the TST influencing AP→P switching, whereas the TST has no effect on the P→AP switching. (Here the data plots of $H_{switch}(T+\Delta T)$ in FIGS. 2e and 2f are obtained from the data of FIGS. 2a and 2b, respectively.) Thus, the TST originates from the spin currents across the ultra-thin MgO tunnel barrier that are induced by the vertical temperature gradient. The TST, in fact, increases $H_{switch}^{AP \to P}$, implying that the minority spins of the RL are accumulating in the FL due to the temperature difference across the barrier (FL is hotter than the RL), thereby favoring the AP configuration. Such large spin accumulations are consistent with those previously observed in silicon when temperature gradients are applied across a tunnel spin injector (18), although we estimate that the spin currents generated in our studies are at least 10,000 times greater due to the larger (×10) temperature gradients and the significantly less resistive (×10⁶) ultra-thin tunnel barriers used here. The magnitude of the spin current that depends on the flow of charge currents will depend sensitively on the thickness of the MgO tunnel barrier, decreasing rapidly with small increases in its thickness (9), which is consistent with the absence of any previous reports of TST-induced MTJ switching (15-17).

In order to investigate the angular dependence of the TST, similar measurements were performed on another device (device II), where the FL was patterned at 120° to the RL as shown in FIG. 3a. Due to the shape anisotropy of the FL, the TMR curve shows multiple steps corresponding to the relative orientation of the FL with respect to the RL (FIG. 3b). Consequently, we can compare the $H_{switch}(T)$ and $H_{switch}(T+\Delta T)$ for various different orientations of the FL relative to the RL, and evaluate the angular dependence of the TST as shown in FIG. 3c. We find that except for the AP to P switching ($H_{switch}^S$, $H_{switch}^B$ and $H_{switch}^G$, denoting the three portions of FIG. 3b labeled A, B, and G), all the other $H_{switch}(T)$ and $H_{switch}(T+\Delta T)$ (data (see the four portions of FIG. 3b labeled C, D, E, and F) overlap each other, once again showing evidence for a temperature gradient driven solely by spin currents influencing MTJ switching, and also confirming that our temperature estimate procedure of the MTJ is accurate. The switching fields ($H_{switch}$) for both devices I and II behave similarly—showing there is a contribution of TST to AP→P switching but no contribution to P→AP switching.

We performed magneto-Seebeck (15-17) measurements (FIG. 4) on our devices to estimate the magnitude of the STT that would be obtained from thermoelectric charge currents. The maximum magnitude of the magneto-Seebeck voltage that develops across the MTJ in the open-circuit configuration (i.e., when $I_{MTJ}=0$) corresponds to the maximum temperature gradient (maximum $I_{Heater}$) in these devices and is ~60 μV (FIGS. 4b and 4c). (FIGS. 4d and 4e show the magneto-Seebeck voltage dependence of devices I and II, respectively, as a function of $I_{Heater}$.) This voltage would induce at most a current density j~1×10³ A/cm² (the Resistance-Area product of the tunnel junction is ~6 Ω-μm²) across the tunnel barrier, which is too small to account for changes in the AP→P switching fields $|H_{switch}^{AP \to P}(T+\Delta T) - H_{switch}^{AP \to P}(T)|$ of ~5-10 Oe reported here. These devices require an STT that would be created by a charge current density of ~1×10⁶ A/cm² across the tunnel barrier, in order to change their switching fields by 10 Oe, as discussed below.

We performed STT measurements on the MTJ devices to find out the effect of charge currents (passed through the tunnel barrier) on the switching fields of the devices and to make sure that the devices studied here behave properly. Typically, current densities>5×10⁶ A/cm² are needed to switch the most efficient MTJs with STT alone. Such high current densities are bound to create large amounts of heat in the MTJs (see FIG. 5), especially at low temperatures as in our case (the measurements were performed at a base temperature of 10 K), owing to small heat capacities of the materials at low temperatures.

For the geometry of our device, the RL is much better thermally grounded than the FL, owing to the RL's much larger dimensions. As a consequence, for large current densities across the MTJ, the FL will be hotter than the RL. Thus, for large current densities of either polarity, the temperature gradient will always be in the same direction with the FL being hotter than the RL, which would induce TST along with STT. Also, owing to small specific heat at low temperatures, the temperature of the device will change by a large amount for current densities such as those indicated in FIG. 5. In other words, in trying to perform the regular STT measurements, because of heating in the device, it is necessary to take into account the temperature, temperature gradient (TST), as well as STT effects, when comparing the switching fields as a function of j. With this in mind, we present data taken with current densities up to 3.5×10⁵ A/cm² for device I (see FIG. 6).

As per the COMSOL simulation (see FIG. 5), the device I, upon flowing 3.5×10⁵ A/cm² current across the tunnel junction, warms up by a small amount of about 2 K but creates a substantial temperature gradient across the tunnel barrier (0.1 K across the 0.9 nm thick MgO) because of the geometry of the device. So, for device I, we would expect to see contributions from STT as well as TST, whereas the effect due solely to temperature will be negligible. This is why $H_{switch}^{AP \to P}$ increases significantly for 3.5×10⁵ A/cm² (see FIG. 6f), as the TST and STT will both increase the switching field, whereas for +3.5×10⁵ A/cm² (see FIG. 6f), STT would decrease the $H_{switch}^{AP \to P}$, while the TST would increase the switching field (the RL is connected to ground). On the other hand since $H_{switch}^{AP \to P}$ does not depend on TST, all we should see is the STT effect due to the change in the current's polarity through the MTJ. This is exactly what is observed; for 3.5×10⁵ A/cm², $H_{switch}^{P \to AP}$ decreases, whereas for +3.5×10⁵ A/cm² $H_{switch}^{P \to AP}$ increases (see FIG. 6e). Note that for an MTJ, the current j needed for P→AP switching is larger than that needed for AP→P switching.

As is evident from FIG. 6, for a change of 5-10 Oe in $H_{switch}^{AP \to P}$, charge currents on the order of 10⁵-10⁶ A/cm² are needed. (FIG. 6a shows the TMR of device I at 10 K, which was shown in the inset of FIG. 2a, whereas $H_{switch}$ as a function of j is shown in FIG. 6b. FIG. 6c shows the TMR of device I at 10K for different j, and FIG. 6d shows the resistance of device I at 10K as a function of j for AP and P states.) If the temperature gradient estimated from COMSOL simulations are assumed to be accurate, another point would be that the TST generated from 0.1 K across the barrier almost compensates the STT generated by j~3.5×10$^5$ A/cm$^2$ (see FIG. 6f). Assuming that things scale linearly, this would imply that a 1 K/nm temperature gradient should provide spin currents equivalent to the STT generated by j~3.5×10$^6$ A/cm$^2$, which is similar in magnitude to the results obtained from the magneto-Seebeck measurements discussed in FIG. 4. This is also consistent with a report (24) on similar devices, which showed changes in switching fields of ~10 Oe for j~1×10$^6$ A/cm$^2$ at room temperature. We note that in this reported measurement, the temperature gradient across the tunnel barrier and any TST emanating from it was not taken into account.

It is clear from the discussion above that self-heating from the tunnel barrier due to larger current density represents a complication. Furthermore, the results cannot be accounted for by the difference in temperature of the free layer in the P and AP states arising from differences in the thermal conductivity of the MTJ in these two states, since this leads to changes in temperature that are much too small to account for these observations (27). We note that this would mean, for example, that the FL of the MTJ in the AP configuration would have to be 15 K hotter (dashed line in FIG. 2e) than in the P configuration, for $I_{Heater}$=0.15 mA, which is unrealistic. We can also obtain $H_{switch}$ from the magneto-Seebeck measurements for |$I_{Heater}$|≥0.1 mA, where the P→AP and AP→P switching can be ascertained (FIG. 4b). Even though the thermoelectric charge current vanishes in the open circuit configuration, we find evidence of the thermo-spin current (9) that exerts TST, thereby influencing $H_{switch}^{AP \to P}$ but not $H_{switch}^{P \to AP}$ (see the data points denoted by open circles in FIGS. 2e and 2f) for device I. This is why the $H_{switch}^{AP \to P}$ and $H_{switch}^{P \to AP}$ in the open-circuit configuration are the same, within experimental error, as those measured in the closed-circuit configuration for the same temperature gradient.

In order to ascertain the origin of the TST, experiments were also performed on another device III (with its TEM being shown in FIG. 7a), which was fabricated with a different magnetic stack grown on a MgO (100) substrate. The layer sequence from bottom to top was given by: 7.5 Ta|12.5 IrMn|0.6 CoFeB|3 CoFe|0.4 Ru|2.7 CoFe|0.9 MgO|2 CoFeB|5 Ta|5 Ru (where the numbers represent film thicknesses in nanometers). Here the magnetic electrodes of the MTJ adjacent to the MgO tunnel barrier are different from devices I and II. Performing the same analysis (FIG. 7c and d) of comparing $H_{switch}$(T+ΔT) in both the open and closed circuit configurations with $H_{switch}$(T), all the measurements for device III are found to overlap each other. This once again confirms the validity of the temperature estimation procedure, while showing no appreciable TST for either AP→P or P→AP switching, even though the TMR (~126%) for device III (FIG. 7b) is almost five times higher than that of the other devices (the RA of device III is ~6 Ω-μm$^2$, which is the same as devices I and II).

As is now explained below, the TST depends on the current-voltage (IV) characteristics of the MTJ. FIG. 7e shows the normalized tunneling conductance $$G_{norm}(V) = \frac{G(V)}{G(V \to 0)}, \text{ where } G(V) = \frac{I(V)}{V}$$

for devices II and III in their respective AP and P states. For device II (and I), since there is an asymmetry in the $G_{norm}$ across V=0 in the AP state, evidence of the TST affecting AP→P switching is observed, whereas negligible TST is found for P→AP switching in device II (and I) and both AP→P and P→AP switching of device III, as the $G_{norm}$ is much more symmetric across V=0 in all these cases (FIG. 7f). This asymmetry indicates a change in the tunnel spin polarization (4, 18) of the tunnel barrier as a function of energy near zero bias voltage, which could stem from, for example, changes in the tunneling matrix elements or variations in the local density of states of the magnetic electrodes at the tunnel interface. Furthermore, from FIG. 8 (discussed below) it can be seen that the asymmetry in $G_{norm}$ is consistent with minority spins from the RL accumulating in the FL, when the FL is hotter than the RL in the AP configuration, as is the case for the experiments discussed below.

FIG. 8a shows a schematic of the devices discussed herein. FIG. 8b shows the normalized conductance $G_{norm}$ for device II in its AP state. FIGS. 8c and 8d are schematic density of states (DOS) plots describing the asymmetry of $G_{norm}$ in FIG. 8b. FIG. 8e elucidates the four current contributions (see the arrows) when there is a temperature gradient across a tunnel barrier. By creating a sharp temperature gradient, one can create a situation where, say, the net flux of spin ↑ electrons flows from the FL into the RL of a magnetic tunnel junction (MTJ), while a net flux of spin ↓ electrons flows in the opposite direction. This would lead to a net small charge current flowing across the junction, while the net spin current is increased, thereby giving a significant TST.

This is happening in the devices described herein, where there is a net minority spin (↓) of the RL accumulating in the FL of the MTJ, when it is in the anti-parallel (AP) state, thereby increasing $H_{switch}^{AP \to P}$ as is observed (see FIG. 2e and FIG. 3c). This is consistent with the asymmetry observed in the conductance characteristic of the MTJ in the AP state (FIG. 8b), where for positive voltage, the current is larger than that for current having the same magnitude of voltage but with the opposite polarity, i.e., $$\frac{G(+V)}{G(-V)} > 1.$$

Such an asymmetry can be obtained in different ways: either by allowing for a change in the polarization P of the magnetic electrodes near the Fermi energy $\epsilon_F$, i.e., $$\left.\frac{\partial P}{\partial \varepsilon}\right|_{\varepsilon_F} \neq 0$$

as shown in FIGS. 8c and 8d, or by allowing for energy dependence of the tunneling matrix elements. Although here we discuss one such scenario where the polarization of the FL is allowed to vary near $\epsilon_F$, in any of these scenarios the conductance asymmetry where $$\frac{G(+V)}{G(-V)} > 1$$

would always lead to minority spins from the RL accumulating in the FL, when the FL is hotter than RL ($T_{FL}>T_{RL}$) in the AP configuration, thereby giving evidence for the thermal spin torque (TST).

We postulate that the asymmetry in the conductance is due to the energy dependence of the tunnel matrix elements in the AP state rather than the DOS itself. If this asymmetry were to be in the DOS, such an asymmetry in the IV characteristic of the MTJ would be seen in the P state as well. Regardless, so long as there is an asymmetry in the tunnel conductance of the MTJ, TST effects would be expected.

Accordingly, temperature gradients of ~1 K/nm across an ultra-thin tunnel barrier can induce large spin currents, and thus a giant TST, which can influence MTJ switching. The measurements reported here are performed with static temperature gradients. Much sharper temperature gradients can be created on short time scales to create greater TST, which can be large enough to switch an MTJ with pure temperature gradients alone, thereby making it relevant to Magnetic Random Access Memory (MRAM) technology (28). For example, the MTJs described herein can form part of an MRAM device, in which many MTJs form an array of such devices, thereby permitting data to be written into and read out of the MRAM device.

Alternatively, the MTJs described herein may form components within a racetrack memory device, e.g., for data storage. In such an embodiment, the free layers of the MTJs may form a continuous layer used for data storage and retrieval. In still other embodiments, a double magnetic tunnel junction may be employed. In this case, a free magnetic layer may be sandwiched between two tunnel barriers, each of which is in proximity with a respective reference layer.

In yet other embodiments, a magnetic free layer of an MTJ may be brought into a precessional state through the use of TST, with or without the assistance of an external magnetic field applied to the magnetic tunnel junction and/or an electrical spin current that flows across the magnetic tunnel junction.

The temperature gradient across the MTJ can be created more efficiently (e.g., increased) by optimizing the geometry and/or materials that form the MTJ. In particular, the resistivities of the free and reference magnetic layers can selected so that a temperature gradient is created at least in part by flowing current across the magnetic tunnel junction itself. For example, the resistivity of one of the magnetic layers can be increased by alloying or doping with elements that increase electron scattering. CoFeB can be used to this end, since its resistivity is significantly higher than CoFe. Alternatively, ferromagnetic nitrides can be used and their resistivity can be tuned over a wide range by varying the nitrogen concentration.

An MTJ can also be constructed in which the free and reference magnetic layers have different cross-sectional areas. In such a geometry, a current flowing through the MTJ will have a current density that varies throughout the magnetic layers. This means that different amounts of heat are produced in different portions of the MTJ (e.g., the heat produced in the magnetic free layer is different in this situation than the heat produced in the magnetic reference layer). Accordingly, a temperature gradient across the MTJ is produced, leading to TST.

The invention may be embodied in other specific forms without departing from its spirit or essential characteristics. The described embodiments are to be considered in all respects only as illustrative and not restrictive. The scope of the invention is therefore indicated by the appended claims rather than the foregoing description. All changes within the meaning and range of equivalency of the claims are to be embraced within that scope.

REFERENCES

1. R. Venkatasubramanian, E. Siivola, T. Colpitts, B. O'Quinn, Nature 413, 597-602 (2001).
2. G. E. W. Bauer, A. H. MacDonald, S. Maekawa, Solid State Commun. 150, 459-552 (2010).
3. G. E. W. Bauer, E. Saitoh, B. J. van Wees, Nat Mater 11, 391-399 (2012).
4. M. Johnson, R. H. Silsbee, Phys. Rev. B 35, 4959-4972 (1987).
5. J. C. Slonczewski, J Magn Magn Mater 159, L1-L7 (1996).
6. L. Berger, Phys Rev B 54, 9353-9358 (1996).
7. J. Z. Sun, J Magn Magn Mater 202, 157-162 (1999).
8. M. Hatami, G. E. W. Bauer, Q. Zhang, P. J. Kelly, Phys. Rev. Lett. 99, 066603 (2007).
9. X. Jia, K. Liu, K. Xia, G. E. W. Bauer, Phys. Rev. Lett. 107, 176603 (2011).
10. K. Uchida et al., Nature 455, 778-781 (2008).
11. K. Uchida et al., Nat Mater 10, 737-741 (2011).
12. C. M. Jaworski et al., Nat Mater 9, 898-903 (2010).
13. K. Uchida et al., Nat Mater 9, 894-897 (2010).
14. A. Slachter, F. L. Bakker, J. P. Adam, B. J. van Wees, Nature Phys. 6, 879-882 (2010).
15. N. Liebing et al., Phys Rev Lett 107, 177201 (2011).
16. M. Walter, Nature Mater. 10, 742-746 (2011).
17. W. Lin et al., Nat Commun 3, 744 (2012).
18. J. C. Le Breton, Nature 475, 82-85 (2011).
19. E. Padrón-Hernández, A. Azevedo, S. M. Rezende, Phys Rev Lett 107, 197203 (2011).
20. S. Krause, G. Herzog, A. Schlenhoff, A. Sonntag, R. Wiesendanger, Phys Rev Lett 107, 186601 (2011).
21. M. Hatami, G. E. W. Bauer, Q. Zhang, P. J. Kelly, Phys. Rev. B 79, 174426 (2009).
22. J. C. Slonczewski, Phys. Rev. B 82, 054403 (2010).
23. H. Yu, S. Granville, D. P. Yu, J. P. Ansermet, Phys Rev Lett 104, 146601 (2010).
24. A. Chanthbouala et al., Nat Phys 7, 626-630 (2011).
25. S. S. P. Parkin et al., Nat Mater 3, 862-867 (2004).
26. S. Yuasa, T. Nagahama, A. Fukushima, Y. Suzuki, K. Ando, Nat Mater 3, 868-871 (2004).
27. F. K. Dejene, J. Flipse, G. E. W. Bauer, B. J. van Wees, Nat Phys 9, 636-639 (2013).
28. J. Akerman, Science 308, 508-510 (2005).

The invention claimed is:

1. A method, comprising:
   creating a temperature gradient across a tunnel barrier that separates a magnetic reference layer and a magnetic free layer, thereby inducing a thermal spin current across the tunnel barrier, wherein the magnetic layers and the tunnel barrier form a magnetic tunnel junction; and
   switching the magnetic free layer with at least one of a magnetic field and an electrical spin current, wherein the thermal spin current reduces the magnitude of said at least one of the magnetic field and the electrical spin current required to switch the magnetic free layer,
   wherein the magnetic layers and the tunnel barrier are configured such that tunneling conductance, between the magnetic layers, across the tunnel barrier is asymmetric with respect to bias voltage across the tunnel barrier.

2. The method of claim 1, wherein the tunnel barrier is non-magnetic.

3. The method of claim 1, wherein the magnetic free and magnetic reference layers have resistivities such that the temperature gradient is created at least in part by flowing current across the magnetic tunnel junction itself.

4. The method of claim 1, wherein the magnetic free and magnetic reference layers exhibit perpendicular magnetic anisotropy.

5. The method of claim 1, wherein the magnetizations of the magnetic free and magnetic reference layers are perpendicular to each other.

6. The method of claim 1, wherein a temperature gradient is also created across a second tunnel barrier that separates the magnetic free layer from a second magnetic reference layer.

7. The method of claim 1, wherein the magnetic free layer of the magnetic tunnel junction forms part of a racetrack device.

8. The method of claim 1, wherein the magnetic tunnel junction is part of a magnetic random access memory device.

9. The method of claim 1, wherein the magnetic free and magnetic reference layers have different cross-sectional areas, such that a current flowing through the magnetic tunnel junction corresponds to different current densities throughout the magnetic layers, so that different amounts of heat are produced in the magnetic free layer and the magnetic reference layer, thereby creating a temperature gradient across the magnetic tunnel junction.

10. A method, comprising:
creating a temperature gradient across a tunnel barrier that separates a magnetic reference layer and a magnetic free layer, thereby inducing a thermal spin current between the magnetic layers and across the tunnel barrier, wherein the magnetic layers and the tunnel barrier form a magnetic tunnel junction, the thermal spin current reducing the magnitude of the magnetic field or electrical spin current required to switch the magnetic free layer,
wherein the magnetic layers and the tunnel barrier are configured such that the tunneling conductance across the tunnel barrier is asymmetric with respect to bias voltage across the tunnel barrier.

11. The method of claim 10, wherein the thermal spin current is large enough that no magnetic field or electrical spin current is required to switch the magnetic free layer.

* * * * *